US006172497B1

(12) United States Patent
Okumichi

(10) Patent No.: US 6,172,497 B1
(45) Date of Patent: Jan. 9, 2001

(54) HIGH-FREQUENCY WAVE MEASUREMENT SUBSTRATE

(75) Inventor: Takehiro Okumichi, Kyoto (JP)

(73) Assignee: Kyocera Corporation, Kyoto (JP)

( * ) Notice: Under 35 U.S.C. 154(b), the term of this patent shall be extended for 0 days.

(21) Appl. No.: 09/196,547

(22) Filed: Nov. 20, 1998

(30) Foreign Application Priority Data

Nov. 21, 1997 (JP) .................................................. 9-321488

(51) Int. Cl.[7] ................................................ G01R 31/02

(52) U.S. Cl. .......................... 324/158.1; 324/754; 333/33

(58) Field of Search ................................ 324/158.1, 754; 333/26, 33, 246, 247, 260

(56) References Cited

U.S. PATENT DOCUMENTS 4,343,976 * 8/1982 Nasretdin et al. .................... 219/748
4,593,243 * 6/1986 Lao et al. ............................. 324/754
4,851,794 * 7/1989 Williams et al. ...................... 333/33

FOREIGN PATENT DOCUMENTS 2507797 5/1996 (JP) .

OTHER PUBLICATIONS

Williams, et al. "A Coplanar Probe to Microstrip Transition," IEEE Transactions on Microwave Theory and Techniques, vol. 36, No. 7, Jul. 1988, pp. 1219–1223.

Atwater, Harry. "Microstrip Reactive Circuit Elements," IEEE Transactions on Microwave Theory and Techniques, vol. MTT–31, No. 6, Jun. 1983, pp. 488–491.

* cited by examiner

*Primary Examiner*—Safet Metjahic
*Assistant Examiner*—Minh Tang
(74) *Attorney, Agent, or Firm*—Hogan & Hartson, LLP

(57) ABSTRACT

A high frequency wave measurement substrate comprising a dielectric substrate, a ground conductor being formed almost all over a bottom surface of the dielectric substrate, a microstrip line signal conductor and an radial stub-like equivalent ground conductor which is placed in proximity to an end of the microstrip line signal conductor being formed on a top surface of the dielectric substrate, a coplanar line structure wafer probe signal conductor and a ground conductor being electrically connected to both the signal conductor and the equivalent ground conductor, wherein the equivalent ground conductor is composed of a semi-circular or fan-shaped radial stub-like conductor pattern in which non-conductor areas are formed in its radial direction. The equivalent ground conductor is also composed of a plurality of radial conductors which are sharing a center with each other, disposed like an arc, and different from each other in length in the radial direction, and a connecting conductor for electrically connecting the radial conductors to each other electrically. In the high-frequency wave measurement substrate a product of a thickness h of the substrate and a square root of a relative dielectric constant $\epsilon_r$ of the substrate is set to be 1/12 or more and 1/5 or less of a vacuum wavelength $\lambda_{max}$ of a measurement upper limit frequency. Consequently, the standing charge density distribution in the circumferential direction is caused by lower frequencies, so that the low loss transmission frequency band can be expanded.

8 Claims, 12 Drawing Sheets

HIGH-FREQUENCY WAVE MEASUREMENT SUBSTRATE

BACKGROUND OF THE INVENTION

1. Field of the Invention

The present invention relates to a high-frequency wave measurement substrate used for measuring electrify characteristics of semiconductor elements, semiconductor element package or circuit boards which use a microstrip line in high frequencies such as microwaves and millimeter waves, more particularly to a wide-band low-loss high-frequency wave measurement substrate whose measurable frequency band is enhanced.

2. Description of the Related Art

For measurement and evaluation of electric characteristics of a semiconductor element, a semiconductor element package or circuit board in a high-frequency band such as a microwave or a millimeter wave, a wafer probe is used at the measuring instrument side, which comes in contact with a coplanar line to enable its highly accurate measurement. On the other hand, a microstrip line is usually used as a transmission line at an input/output part of a measurement object such as a fast digital or high-frequency circuit for radio communication apparatuses using high-frequency wave signals, a high-frequency semiconductor element, and a package for housing such a high-frequency semiconductor element. Consequently measurement of electric characteristics in a high-frequency wave using a wafer probe needs a line converter to cope with a connection between the coplanar line of the wafer probe and the microstrip line of the measurement object. The line converter is required to transmit high-frequency wave signals without so much loss thereby to extract the characteristics of the object very accurately.

Conventionally, the line converter has been generally designed to have such a structure that the widths of signal and ground conductors of the coplanar line portion correspond to the sizes required by a wafer probe head. One end of the converter is connected to one end of the microstrip line so that the signal conductor width is changed smoothly on both sides-. The ground conductor of the coplanar line is thus connected to the ground conductor of the microstrip line via a through conductor such as a through-hole and a via hole.

FIG. 16 shows a top view of the structure of a conventional line converter. A conductor film is applied to almost the entire of the bottom surface of a dielectric substrate 1 having a relative dielectric constant of 9.6 and a thickness of 200 $\mu$m to form a ground conductor. Then, the width of the signal conductor 2 of the microstrip line portion and the width of the signal conductor 3 of the coplanar line portion are set to 190 $\mu$m and 160 $\mu$m, respectively, and the interval between the signal conductor 3 of the coplanar line portion and the ground conductors 4 and 4' is set to 135 $\mu$m. The ground conductors 4 and 4' are electrically connected to the ground conductor formed on the bottom surface via 150 $\mu$m diameter through-holes 5 and 5' which are through conductors. The structure of each ground conductor of the coplanar line portion is thus formed like a through-hole pad. If the electric characteristics are measured and extracted from those two ground conductors of the same shape formed as described above and placed so as to face each other symmetrically like an object and its mirror image via the microstrip line portion, the frequency characteristics as shown in FIG. 17 are obtained.

In FIG. 17, the lateral axis indicates frequencies in units of GHz, and the ordinate axis indicates transmission coefficients in units of dB used as evaluation indices for the amount of transmitted signals of all the input signals. The characteristic curve indicates the frequency characteristics for transmission coefficients. From this measurement result it is found that the higher the frequency is, the smaller the transmission coefficient is and the more the amount of transmitted signals is reduced.

In addition to such a high-frequency wave measurement substrate composed as described above, there is also another type high-frequency wave measurement substrate disclosed as "Microstrip Line portion Measurement Jig" in Japanese Registered Utility Model Publication JP-Z2 2507797. Unlike the above measurement substrate, this jig is formed by converting the coplanar line and the microstrip line without using any through conductors such as through-holes and via holes. According to JP-Z2 2507797, a measurement jig (measurement substrate) 10 is structured as shown in FIG. 18 (top view) so that the tip of a microstrip line 12 provided on an dielectric substrate 11 which has a ground conductor on its bottom surface is stepped or tapered. Its width is thus matched with the width of a center conductor of a probe head 13 and connected to the center conductor. Then, around the tip of the microstrip line 12 is formed an equivalent ground with a semi-circular or an approximate semi-circular fan-shaped radial stub 14 thereby to correspond to two ground line conductors of a probe head 13. In addition, the radius of a radial stub 14 is decided to be an effective length of about ½ wavelength of the lower limit of the measurement frequency.

The utility model has proved that measured data can be reproduced very well with such a configuration of the measurement jig, since no connecting means is used between the ground conductors for connecting the probe head 13 to the measurement jig 10 using an element whose characteristics are varied like the ribbon bonding and the through conductor described above.

It may be said that the principle of the equivalent ground formed with this semi-circular or fan-shaped radial stub 14 is equivalent to a general phenomenon of the radial stub to occur in a high-frequency wave circuit.

In other words, on the basis of IEEE TRANSACTIONS ON MICROWAVE THEORY AND TECHNIQUES, VOL. 36, NO. 7, JULY 1988 "A Coplanar Probe to Microstrip Transition", a reactance value X of a radial stub 15 shaped as shown in FIG. 19 (top view) will be represented in the following expressions, wherein h is a thickness of the substrate on which this radial stub 15 is formed, $r_1$ and $r_2$ are inner and outer diameters of the radial stub 15, θ is a radial center angle, $\epsilon_{re}$ is an effective relative dielectric constant in the case where a high frequency wave signal transmits a radial along a radius, $\lambda_0$ is a free space wavelength of the high frequency wave signal.

$$X = \frac{h}{2\pi r_1} Z_0(r_1) \frac{360}{\theta} \cdot \frac{\cos(\theta_1 - \psi_2)}{\sin(\psi_1 - \psi_2)} \tag{1}$$

$$\tan\theta_1 = \frac{N_0(kr_1)}{J_0(kr_1)} \tag{2}$$

$$\tan\psi_1 = -\frac{N_i(kr_1)}{J_i(kr_1)},\ (i = 1, 2) \tag{3}$$

$$Z_0(r_1) = \frac{120\pi}{\sqrt{\varepsilon_{re}}} \cdot \frac{\sqrt{J_0^2(kr_1) + N_0^2(kr_1)}}{\sqrt{J_i^2(kr_1) + N_i^2(kr_1)}} \tag{4}$$

-continued $$k = \frac{2\pi\sqrt{\varepsilon_{re}}}{\lambda_0} \tag{5}$$

In the above expressions, $J_i(x)$ and $N_i(x)$ are i-order Bessel functions.

According to the principle, the operation of the radial stub in a high-frequency wave goes into an almost perfect reflection state, so that the radial stub can be regarded to be an equivalent ground. Accordingly the radial stub with such an effect is usable as an equivalent ground in a high-frequency wave measurement substrate. The radial stub 14 disclosed in JP-Z2 2507797 uses such effect, and characteristics of a high-frequency wave measurement substrate of the radial stub are extracted.

FIG. 22 is a top view indicating a conventional high-frequency wave measurement substrate which uses a radial stub. The conventional high-frequency wave measurement substrate is formed as a fan-shaped radial stub having inner and outer diameters of 215 $\mu$m and 580 $\mu$m, respectively, and a center angle of 230° in such a manner that firstly a metallic film as a ground conductor is coated almost all over the bottom surface of an dielectric substrate 21 having a relative dielectric constant of 9.6 and a thickness of 200 $\mu$m, then a microstrip line signal conductor 22 as well as coplanar line signal conductors 23 and 23' are formed on the top surface of the substrate, and thereafter coplanar line ground conductors 24 and 24' are formed at distances of 135 $\mu$m from the signal conductors 23 and 23'. The electrical characteristics of this high-frequency wave measurement substrate are measured and measurement results obtained are as shown in FIGS. 20 and 21.

In FIG. 20, the lateral axis indicates frequencies in units of GHz and the ordinate axis indicates reflection coefficients in units of dB as evaluation indices for the amount of reflected signals of all the entered signals. In FIG. 20 a characteristic curve S indicates simulation results and a characteristic curve M indicates measured values. In FIG. 21, the lateral axis indicates frequencies in units of GHz and the ordinate axis indicates transmission coefficients in units of dB as evaluation indices for the amount of transmitted signals of all the entered signals. In FIG. 21 a characteristic curve S indicates simulation results and a characteristic curve M indicates measured values. It will be understood from these results that using a radial stub as an equivalent ground is very effective to obtain a high-frequency wave measurement substrate having low loss transmission frequency band characteristics.

In the case of the conventional high-frequency wave measurement substrate as described above, however, when it uses any through conductors such as through-holes and via holes as shown in FIG. 16, the grounds are not stabilized due to the inductance component of those through conductors in a microwave band, and even in a millimeter wave band. Consequently, the continuity of the characteristic impedance is lost, whereby input signals are more reflected and the amount of transmitted signals of high-frequency wave signals is reduced. In addition, the prior art has been confronted with a problem that it is difficult to manufacture such a high-frequency wave measurement substrate very accurately, since it needs processes for processing the through conductors.

Furthermore, when an equivalent ground formed as a semi-circular or fan-shaped radial stub is used as shown in FIG. 18 and FIG. 22, it is required to set the thickness properly for the dielectric substrate. Otherwise, it is difficult to obtain a predetermined effect of the equivalent ground even in a frequency in which the effect is expected as a matter of course. In addition, the high-frequency wave measurement substrate is adversely affected by a high-order mode, whereby the amount of transmitted high-frequency signals is reduced.

Furthermore, when an equivalent ground formed as a semi-circular or fan-shaped radial stub is used as shown in FIG. 18 and FIG. 22, the charge density distribution in the circumferential direction becomes a standing distribution, in which the charge density rises both at the end and at an intermediate point of the semi-circle or fan-shape in the circumferential direction in a frequency in which the length of the semi-circle or the fan-shape in the circumferential direction is equal to an effective value of one wavelength around the center of the semi-circle or the fan-shape in the radial direction. As a result, the equivalent ground generates a resonance. Consequently, the effect of the equivalent ground is hardly obtained around the resonant frequency. The continuity of the characteristic impedance is thus lost and this causes input signals to be reflected more and the transmitted high-frequency wave signals to be reduced more. In addition, when this resonant frequency exists in the low loss transmission frequency band or around the band, the measurable frequency band of the high-frequency wave measurement substrate is narrowed.

SUMMARY OF THE INVENTION

Under such circumstances, it is an object of the present invention to provide a high-frequency wave measurement substrate which uses a radial stub as an equivalent ground and expand the low loss transmission frequency band by moving the resonant frequency of the radial stub to the low-frequency side thereby to solve the above related art problems.

It is another object of the present invention to provide a high-frequency wave measurement substrate which uses a radial stub as an equivalent ground and expand the low loss transmission frequency band by stabilizing the equivalent ground thereby to suppress an increase of transmission loss caused by the high-order mode.

In a first aspect of the invention there is provided a high-frequency wave measurement substrate comprising an dielectric substrate, a ground conductor being formed almost all over a bottom surface of the dielectric substrate, a microstrip line signal conductor and a semi-circular or fan-shaped radial-stub-like equivalent ground conductor which is placed in proximity to an end of the microstrip line signal conductor being formed on a top surface of the dielectric substrate, a coplanar line structure wafer probe signal conductor and a ground conductor being electrically connected to both the signal conductor and the equivalent ground conductor, wherein a non-conductor area is provided in part of the equivalent ground conductor in a radial direction thereof.

According to the invention, the equivalent ground conductor formed on the top surface of an dielectric substrate is formed like a semi-circle or fan-shaped radial stub so that the equivalent ground conductor comes in contact with the coplanar line structure wafer probe ground conductor to electrically connect thereto. The non-conductor area in which no conductor is formed are thus provided in part of the equivalent ground conductor in the radial direction thereof. Consequently, the standing charge density distribution in the circumferential direction of the semi-circle or the fan-shaped shape occurs with lower frequencies than when no non-conductor area is provided.

Consequently, the resonant frequency can bet moved to the low frequency side of the low loss transmission frequency band compared with the prior art, in which the charge density distribution in the circumferential direction becomes a standing distribution to generate a resonance, in which the charge density rises both at the end and at an intermediate point of the semi-circle or fan-shape in the circumferential direction in a frequency within the low loss transmission frequency band, in which the length of the semi-circle or the fan-shape in the circumferential direction is equal to an effective value of one wavelength around the center of the approximate semi-circle or fan-shape in the radial direction. As a result, the low loss transmission frequency band is expanded thereby to provide a high-frequency wave measurement substrate provided with wide range low loss characteristics.

In a second aspect of the invention it is preferable that a length of the non-conductor area in the radial direction is equal to or more than a half of a width of the equivalent ground conductor in the radial direction.

According to the invention, the length of the non-conductor area in the radial direction is equal to or more than a half of the width of the semicircular or fan-shaped radial-stub-like equivalent ground conductor in the radial direction in the high-frequency wave measurement substrate, thereby the standing charge density distribution of the radial-stub-like equivalent ground conductor in the circumferential direction occurs with lower frequencies more effectively than when such a non-conductor area is not provided. Consequently, the resonant frequency can be moved to the low frequency side of the low loss transmission frequency band compared with the related art, in which the charge density distribution becomes a standing distribution to generate a resonance, in which the charge density rises both at the end and at an intermediate point of the semi-circle or fan-shape in the circumferential direction in a frequency within the low loss transmission frequency band, in which the length of the semi-circle or the fan-shape in the circumferential direction is equal to an effective value of one wavelength around the center of the semi-circle or fan-shape in the radial direction. As a result, the low loss transmission frequency band is expanded thereby to provide a high-frequency wave measurement substrate provided with wide range low loss characteristics.

Furthermore, in a third aspect of the invention it is preferable that the non-conductor area is positioned at about ¼ or about ¾ of a center angle of the equivalent ground conductor.

According to the invention, a non-conductor area is provided in the radial-stub-like equivalent conductor in the circumferential direction thereof so that it is positioned in the circumferential direction at about ¼ or about ⅓ of the center angle of the semi-circle or the fan-shape. Consequently, it is possible to generate a frequency causing a standing charge density distribution in the circumferential direction of the semi-circle or the fan-shape in the radial-stub-like equivalent ground conductor with lower frequencies more effectively than when such a non-conductor area is not provided. Consequently, the resonant frequency can be moved to the low frequency side of the low loss transmission frequency band compared with the related art, in which the charge density distribution in the circumferential direction becomes a standing distribution to generate a resonance, in which the charge density rises both at the end and at an intermediate point of the semi-circle or fan-shape in the circumferential direction in a frequency within the low loss transmission frequency band, in which the length of the semi-circle or fan-shape in the circumferential direction is equal to an effective value of one wavelength around the center of the semi-circle or fan-shape in the radial direction. As a result, the low loss transmission frequency band is expanded thereby to provide a high-frequency wave measurement substrate provided with wide range low loss characteristics.

Furthermore, in a fourth aspect of the invention it is preferable that one end of the non-conductor area in the radial direction is opened to an inner or outer periphery of the equivalent ground conductor.

According to the invention, since one end of the non-conductor area is opened to the inner or outer periphery of the radial-stub-shaped equivalent ground conductor thereby to form a notch-like portion in the high-frequency wave measurement substrate, a frequency causing a standing charge density distribution to be generated in the circumferential direction of the semi-circle or the fan-shape in the radial-stub-shaped equivalent ground conductor is generated more effectively with lower frequencies than when such a non-conductor area is not provided. Consequently, the resonant frequency can be moved to the low frequency side of the low loss transmission frequency band compared with the related art, in which the charge density distribution in the circumferential direction becomes a standing distribution to generate a resonance, in which the charge density rises both at the end and at an intermediate point of the semi-circular or fan-shaped equivalent ground in the circumferential direction in a frequency within the low loss transmission frequency band, in which the length of the semi-circle or fan-shape in the circumferential direction is equal to an effective value of one wavelength around the center of the semi-circle or fan-shape in the radial direction. As a result, the low loss transmission frequency band is expanded thereby to provide a high-frequency wave measurement substrate provided with wide range low loss characteristics.

Furthermore, in a fifth aspect of the invention there is provided a high frequency wave measurement substrate comprising an dielectric substrate, a ground conductor being formed almost all over a bottom surface of the dielectric substrate, a microstrip line signal conductor and an radial-stub-like equivalent ground conductor which is placed in proximity to an end of the microstrip line signal conductor being formed on a top surface of the dielectric substrate, a coplanar line structure wafer probe signal conductor and a ground conductor being electrically connected to both the signal conductor and the equivalent ground conductor, wherein the equivalent ground conductor is composed of a plurality of radial conductors which are sharing a center with each other, disposed like an arc, and different from each other in length in the radial direction, and a connecting conductor for electrically connecting the radial conductors to each other.

According to the invention, a ground conductor is formed almost all over the bottom surface of an dielectric substrate. On the top surface of the dielectric substrate are formed a microstrip line signal conductor and a radial-stub-like equivalent ground conductor which is formed around the tip of the signal conductor. Then, a coplanar line structure wafer probe signal conductor and a ground conductor are connected electrically to both the signal conductor and the equivalent ground conductor. The equivalent ground conductor is composed of a plurality of radial conductors which are sharing the center with each other, disposed like an arc, and different from each other in length in the radial direction, and a connecting conductor for connecting the radial conductors to each other electrically. Consequently, the standing charge density distribution in the circumferential direction of the semi-circle/fan-shape or fan-face shape in the approximate radial-stub-like equivalent ground conductor occurs with lower frequencies than when the equivalent ground conductor is composed only with a single radial conductor. Consequently, the resonant frequency can be moved to the low frequency side of the low loss transmission frequency band compared with the related art, in which the charge density distribution in the circumferential direction becomes a standing distribution to generate a resonance, in which the charge density rises both at the end and at an intermediate point of the semi-circular or fan-shaped equivalent ground in the circumferential direction in a frequency within the low loss transmission frequency band, in which the length of the semi-circle or the fan-shape in the circumferential direction is equal to an effective value of one wavelength around the center of the approximate semi-circle or fan-shape in the radial direction. As a result, the low loss transmission frequency band is expanded thereby to provide a high-frequency wave measurement substrate provided with wide range low loss characteristics.

Furthermore, in a sixth aspect of the invention it is preferable that a length of the connecting conductor in the radial direction is equal to or less than a half of the length of the shortest radial conductor in the radial direction.

According to the invention, therefore, since the length of the connecting conductor in the radial direction is equal to or less than a half of the length of the shortest radial conductor in the radial direction in the high-frequency wave measurement substrate, the standing charge density distribution in the circumferential direction of the semi-circle/fan-shape or the fan-shape in the radial-stub-like equivalent ground conductor occurs with lower frequencies than when the equivalent ground conductor is composed only with a single radial conductor. Consequently, the resonant frequency can be moved to the low frequency side of the low loss transmission frequency band compared with the related art, in which the charge density distribution in the circumferential direction becomes a standing distribution to generate a resonance, in which the charge distribution becomes a standing distribution in which the charge density rises both at the end and at an intermediate point of the semi-circle or fan-shape in the circumferential direction in a frequency within the low loss transmission frequency band, in which the length of the semi-circle or the fan-shape in the circumferential direction is equal to an effective value of one wavelength around the center of the semi-circle or fan-shape in the radial direction.

As a result, the low loss transmission frequency band is expanded thereby to provide a high-frequency wave measurement substrate provided with wide range low loss characteristics.

Furthermore, in a seventh aspect of the invention it is preferable that a plurality of the radial conductors are divided into a center radial conductor to be disposed in the center and outside radial conductors disposed at both sides of the center radial conductor and the center angles of the outside radial conductors are about ½ of that of the center radial conductor respectively.

According to the invention, since a plurality of the radial conductors are divided into a center radial conductor to be disposed in the center and outside radial conductors disposed at both sides of the center radial conductor and the center angles of the outside radial conductors are about ½ of that of the center radial conductor respectively, the standing charge density distribution in the circumferential direction of the semi-circle/fan-shape or the fan-shape in the approximate radial-stub-like equivalent ground conductor occurs with lower frequencies than when the equivalent ground conductor is composed only with a single radial conductor. Consequently, the resonant frequency can be moved to the low frequency side of the low loss transmission frequency band compared with the related art, in which the charge density distribution in the circumferential direction becomes a standing distribution to generate a resonance, in which the charge distribution becomes a standing distribution in which the charge density rises both at the end and at an intermediate point of the semi-circle or fan-shape in the circumferential direction in a frequency within the low loss transmission frequency band, in which the length of the semi-circle or the fan-shape in the circumferential direction is equal to an effective value of one wavelength around the center of the semi-circle or fan-shape in the radial direction. As a result, the low loss transmission frequency band is expanded thereby to provide a high-frequency wave measurement substrate provided with wide range low loss characteristics.

Since at least two types of center angles are provided for the plurality of the radial conductors in the configuration of each high-frequency wave measurement substrate of the present invention, or since the connecting conductor is used to connect those radial conductors at their inner peripheries or since the connecting conductor is used to connect those radial conductors at their outer peripheries, the functions and effects of the high-frequency wave measurement substrate are proved more significantly.

In an eighth aspect of the invention it is preferable that a product of a thickness h of the substrate and a square root of a relative dielectric constant $\epsilon_r$ of the substrate is set to be within a range of from 1/12 to 1/5 of a vacuum wavelength $\lambda_{max}$ of a measurement upper limit frequency, namely $\lambda_{max}/12 \leqq h\sqrt{\epsilon_r} \leqq \lambda_{max}/5$.

Taking notice of the relationship among the thickness h of the high-frequency wave measurement substrate, especially the substrate composed of an dielectric substrate, that is, dielectric materials, the relative dielectric constant $\epsilon_r$ of the dielectric materials, and the vacuum wavelength $\lambda$ of the -measurement frequency, the present inventor has carried out various tests and examinations thereby to come to have the following knowledge: If the product of the thickness h of the dielectric substrate and the square root $\sqrt{\epsilon_r}$ of the relative dielectric constant $\epsilon_r$ of the dielectric materials is set to be within a range of from 1/12 to 1/5 of the vacuum wavelength $\lambda_{max}$ of the measurement limit frequency, namely $\lambda_{max}/12 \leqq h\sqrt{\epsilon_r} \leqq \lambda_{max}/5$, the absolute reactance value $|X|$ is reduced in proportion to the reduction of the thickness h as shown in Expression 1 (if the value h is too small, it is difficult to manufacture the high-frequency wave measurement substrate, however) in the case of a high-frequency wave measurement substrate obtained as follows. At first, a ground conductor is formed almost all over the bottom surface of a substrate made of dielectric materials, that is, an dielectric substrate. Then, a microstrip line signal conductor and a semi-circular or fan-shaped radial-stub-like equivalent ground conductor is formed on the top surf ace of the dielectric substrate. The equivalent ground is formed around the tip of this signal conductor. After this, a coplanar line structure wafer probe signal conductor and a ground conductor are connected electrically to both the signal conductor and the equivalent ground conductor. As a result, the reactance value in the radial-stub-like equivalent ground conductor is reduced, so that the low loss transmission frequency band can be expanded. Furthermore, the present inventor has also confirmed that the low loss transmission frequency band can be expanded without any difficulty in manufacturing the high-frequency wave measurement substrate by setting the thickness h of the substrate to satisfy the above relationship between the relative dielectric constant $\epsilon_r$ and the measurement upper limit frequency vacuum wavelength $\lambda_{max}$. The inventor has thus completed the present invention.

In other words, if the product $h\sqrt{\epsilon_r}$ of the thickness h of the dielectric substrate and the square root $h\sqrt{\epsilon_r}$ of the relative dielectric constant $\epsilon_r$ of the dielectric materials is over ⅕ of the vacuum wavelength $\lambda_{max}$ of the measurement limit frequency ($h\sqrt{\epsilon_r}>\lambda_{max}/5$) in a radial-stub-like equivalent ground conductor formed on an dielectric substrate, the low loss transmission frequency band is narrowed significantly due to an increase of the transmission loss caused by the high-order mode. The present invention, however, has solved this problem by satisfying $h\sqrt{\epsilon_r}\leqq\lambda_{max}/5$).

Furthermore, if the product $h\sqrt{\epsilon_r}$ of the thickness h of the dielectric substrate and the square root of the relative dielectric constant $\epsilon_r$ of the dielectric materials is below 1/12 of the vacuum wavelength $\lambda_{max}$ of the measurement limit frequency ($h\sqrt{\epsilon_r}<\lambda_{max}/12$), the substrate becomes so thin that it is difficult to manufacture the substrate. According to the present invention, however, the inventor has solved this problem by satisfying the $\lambda_{max}/12\leqq\sqrt{\epsilon_r}$.

Consequently, according to the invention, it is possible to reduce the transmission loss as much as possible without any difficulty in the manufacturing by stabilizing each equivalent ground thereby to suppress the transmission of signals in the high-order mode. Consequently, it is possible to provide a wide range low loss high-frequency wave measurement substrate for which a wide low loss transmission frequency band is secured.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Figure 1:
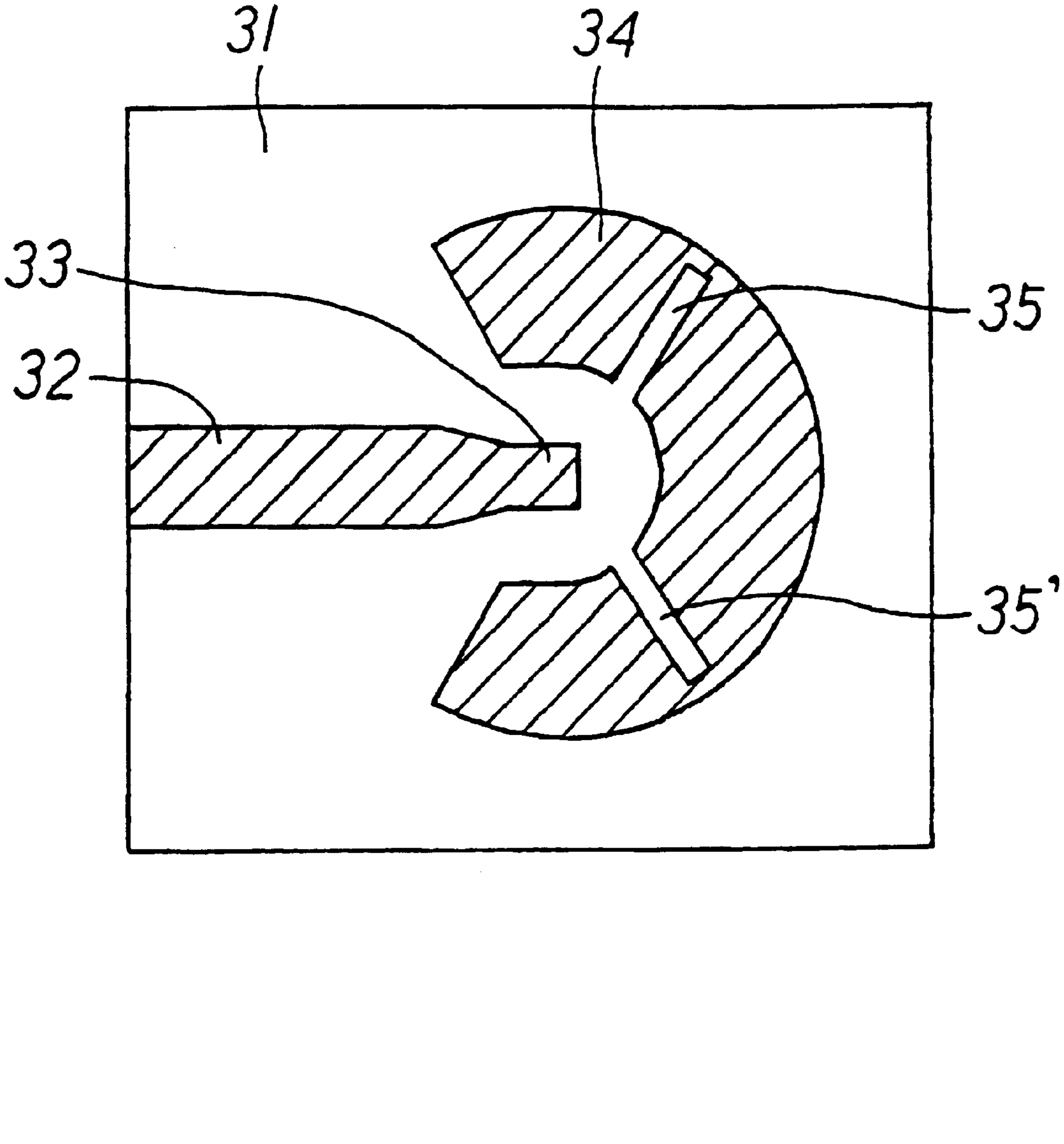
FIG. 1 is a top view indicating an embodiment of a high-frequency wave measurement substrate according to the first aspect of the present invention.

Now referring to the drawings, preferred embodiments of the invention are described below.

FIG. 1 is a top view indicating an embodiment of a high-frequency wave measurement substrate according to the first aspect of the invention. The substrate is formed as follows. At first, a ground conductor is formed almost all over the bottom surface of an dielectric substrate 31 and a microstrip line signal conductor 32 is formed on the top surface of the dielectric substrate 31. The tip of this signal conductor 32 forms a coplanar line portion signal conductor 33 electrically connected to the conductor 32. The coplanar line portion signal conductor 33 serves as a part which brings a signal conductor of a coplanar line structure wafer probe (not illustrated) into contact with the microstlip line signal conductor 32 to electrically connect them to each other. An equivalent ground conductor. 34 is provided closely to the coplanar line portion signal conductor 33. This equivalent ground conductor 34 is formed with a semicircular or fan-shaped radial-stub-like conductor pattern. The shape, size, position, etc. of the ground conductor 34 are set to be the same as those of the conventional radial stub and the required high-frequency characteristics are satisfied by extending both ends of the ground conductor 34 as needed in accordance with the shape of the tip of the microstrip line signal conductor 32 so as to satisfy the required high-frequency characteristics.

After this, non-conductor areas 35 and 35' are formed in part of the equivalent ground conductor 34 in its radial direction. In this embodiment, each of the non-conductor areas 35 and 35' is opened at one end in the radial direction to the inner periphery of the radial stub-shaped equivalent ground conductor 34. The non-conductor areas 35 and 35' are positioned at about ¼ and at about ¾ of the center angle of the equivalent ground conductor 34 in the circumferential direction, respectively.

The size, shape, position, etc. of the equivalent ground conductor 34 may be set properly so as to prevent adverse effects with respect of high frequencies on other items, as well as to generate a standing charge density distribution with lower frequencies of the transmission frequency band. For example, since the transmission frequency band is expanded when the high-frequency connection of the conductor 34 to the ground conductor formed on the bottom surface is strengthened significantly, a larger radial angle is usually taken. Consequently, the width of the equivalent ground conductor 34 should be smaller than its length in the radial direction so as to be shaped along the radial direction.

Thus, since, for example, by providing a slit-like non-conductor area, the path of the current flowing from end to end in the circumferential direction of the radial stub becomes long, the frequency of the path corresponding to one wavelength is lowered. Accordingly the frequency causing the charge density distribution on the radial stub to become a standing distribution is moved to the low frequency side. However, since the charge density distribution becomes a standing distribution such way, it is most effective to provide each non-conductor area at a position where the current density becomes high.

Figure 2:
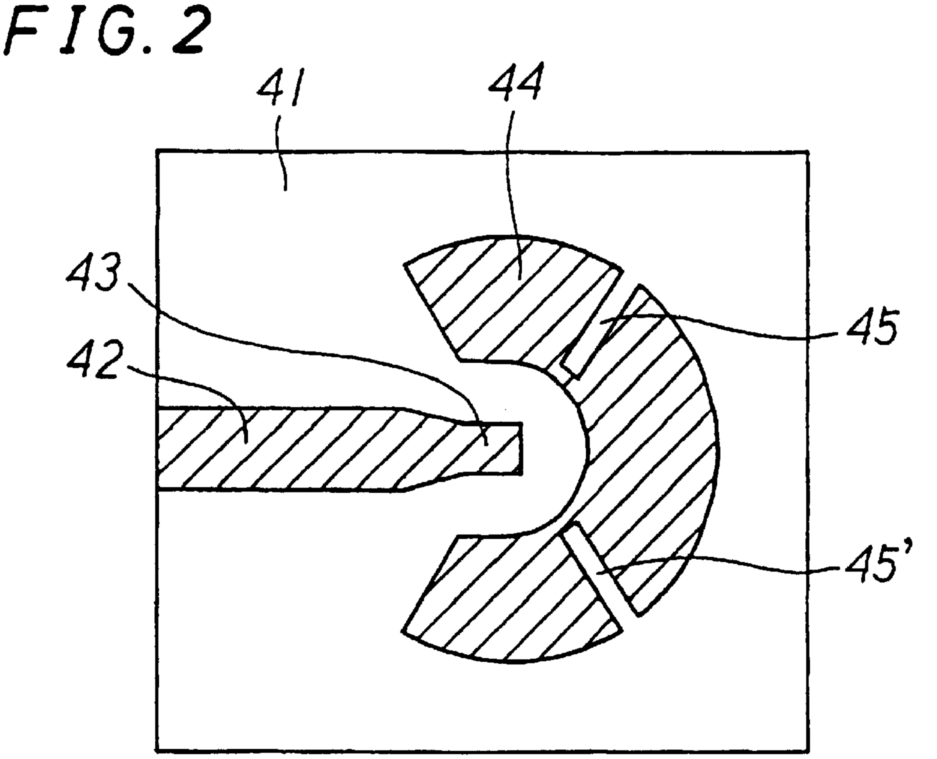
FIG. 2 is a top view indicating another embodiment of the high-frequency wave measurement substrate according to the first aspect of the present invention.

FIG. 2 is a top view of another embodiment of the high-frequency wave measurement substrate according to the first aspect of the invention. The substrate is formed as follows. At first, a ground conductor is formed almost all over the bottom surface of an dielectric substrate 41 and a microstrip line signal conductor 42 is formed on the top surface of the dielectric substrate 41. The tip of this signal conductor 42 forms a coplanar line portion signal conductor 43 electrically connected to the conductor 42. The coplanar line portion signal conductor 43 serves as a part which brings a signal conductor of a coplanar line structure wafer probe (not illustrated) into contact with the microstlip line signal conductor 42 to electrically connect them to each other. An equivalent ground conductor 44 is then provided closely to the coplanar line portion signal conductor 43. This equivalent ground conductor 44 is formed with a semi-circular or fan-shaped radial-stub-like conductor pattern. The shape, size, position, etc. of the ground conductor 44 are set to be the same values as those of the conventional radial stub as described above.

After this, non-conductor areas 45 and 45' are formed in part of the equivalent ground conductor 44 in the radial direction. In this embodiment, each of the non-conductor areas 45 and 45' is opened at one end in the radial direction to the outer periphery of the radial stub-shaped equivalent ground conductor 44. And, the non-conductor areas 45 and 45' are positioned at about ¼ and about ¾ of the center angle of the equivalent ground conductor 44 in the circumferential direction, respectively.

Figure 3:
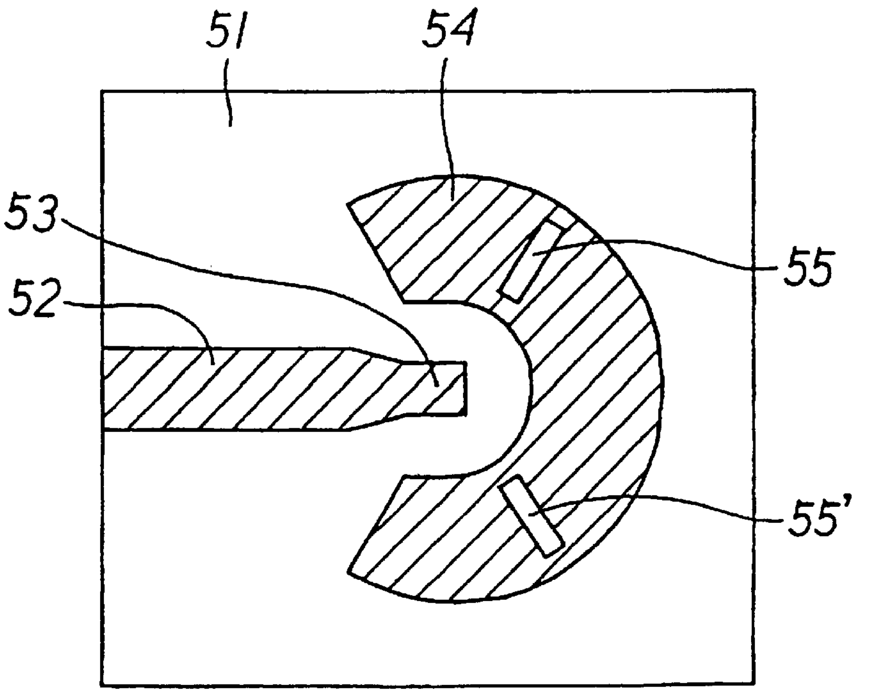
FIG. 3 is a top view indicating still another embodiment of the high-frequency wave measurement substrate according to the first aspect of the present invention.

FIG. 3 is a top view of still another embodiment of the high-frequency wave measurement substrate according to the first aspect of the invention. The substrate is formed as follows: At first, a ground conductor is formed almost all over the bottom surface of an dielectric substrate 51 and a signal conductor 52 of a microstrip line is formed on the top surface of the dielectric substrate 51. The tip of this signal conductor 52 forms a coplanar line portion signal conductor 53 electrically connected to the conductor 52. The coplanar line portion signal conductor 53 serves as a part which brings a signal conductor of a coplanar line structure wafer probe (not illustrated) into contact with the microstlip line signal conductor 52 to electrically connect them to each other. An equivalent ground conductor 54 is then provided closely to the coplanar line portion signal conductor 53. This equivalent ground conductor 54 is formed with a semi-circular or fan-shaped radial-stub-like conductor pattern. The shape, size, position, etc. of the ground conductor 54 are set to be the same values as those of the conventional radial stub as described above.

After this, non-conductor areas 55 and 55' are formed in part of the equivalent ground conductor 54 in the radial direction. In this embodiment, each of the non-conductor areas 55 and 55' is provided at an intermediate position in the radial direction of the radial-stub-like equivalent ground conductor 54. And, the non-conductor areas 55 and 55' are positioned at about ¼ and about ¾ of the center angle of the equivalent ground conductor 54 in the circumferential direction, respectively.

Figure 4:
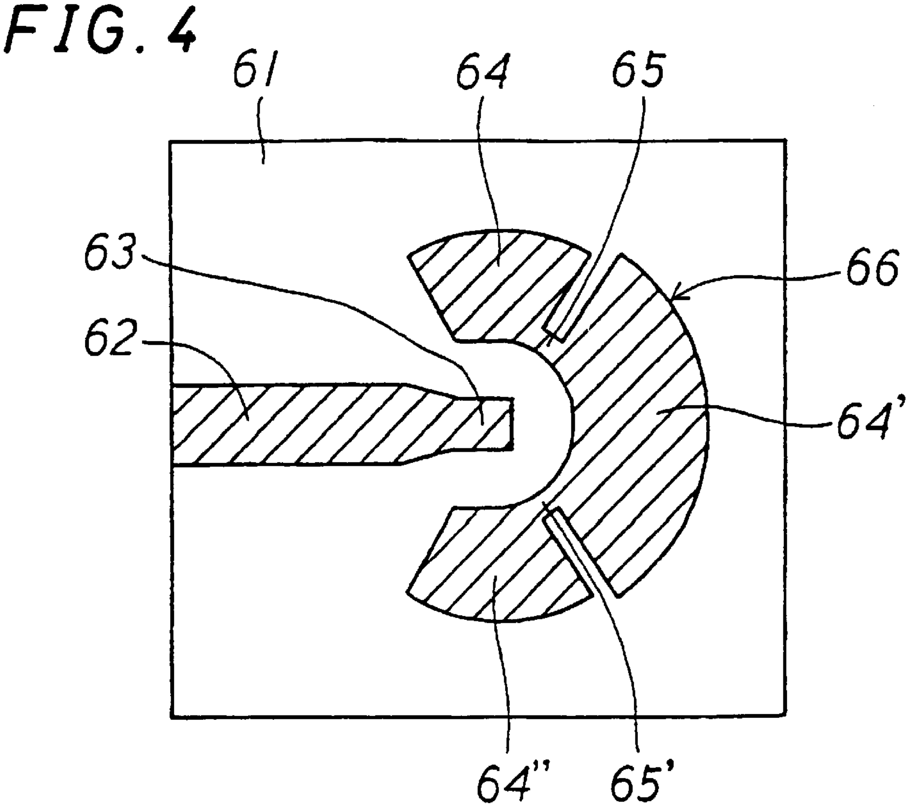
FIG. 4 is a top view indicating an embodiment of a high-frequency wave measurement substrate according to the fifth aspect of the invention.

FIG. 4 is a top view of an embodiment of a high-frequency wave measurement substrate according to the fifth aspect of the invention. The substrate is formed as follows. At first, a ground conductor is formed almost all over the bottom surface of an dielectric substrate 61 and a microstrip line signal conductor 62 is formed on the top surface of the dielectric substrate 61. The tip of this signal conductor 62 forms a coplanar line portion signal conductor 63 electrically connected to the conductor 62. The coplanar line portion signal conductor 63 serapes as a part which brings a signal conductor of a coplanar line structure wafer probe (not illustrated) into contact with the microstlip line signal conductor 62 to electrically connect them to each other.

Radial conductors 64, 64' and 64" are then formed with an approximate semi-circular or fan-shaped conductor pattern around the tip of the microstrip line signal conductor 62. The radial conductors 64, 64' and 64" are disposed like an arc, sharing the center with each other. In this embodiment, the length of the center radial conductor 64' in the radial direction is formed longer than other radial conductors 64 and 64" disposed at both sides of the conductor 64'. Furthermore, the center angle of each of the outside radial conductors 64 and 64" is set to about ½ of the center angle of the conductor 64'.

Furthermore, the radial conductors 64, 64' and 64" are connected electrically to each other using the connecting conductors 65 and 65'. Each of the connecting conductors 65 and 65' is composed of the same conductor as that of the radial conductors 64, 64' and 64". The radial conductors 65 and 65' are formed shorter than the radial conductors 64, 64' and 64" in the radial direction. In this embodiment, the length of each of the connecting conductors 65 and 65' is ½ of that of the radial conductors 64, 64' and 64" or under. The connecting conductors 65 and 65' are used to connect the radial conductors 64, 64' and 64" at their inner peripheries.

Those radial conductors 64, 64' and 64", as well as the connecting conductors 65 and 65' are combined to form an equivalent ground conductor 66 in a approximate radial stub form. The shape, size, position, etc. of this equivalent ground conductor 66 are set to be the same values of those of the conventional radial stub. In addition, both ends; of the equivalent ground conductor 66 are, for example, extended as needed in accordance with the shape of the tip of the microstrip line signal conductor 62 so as to satisfy the required high-frequency characteristics.

The size, shape, position, etc. of the radial conductors 64, 64' and 64", as well as the connecting conductors 65 and 65' may be set properly so as to prevent adverse effects with respect to high frequencies on other items, as well as to generate a standing charge density distribution with lower frequencies than frequencies of the transmission frequency band. For example, since the transmission frequency band is expanded when the high-frequency connection of the conductor 66 to the ground conductor formed on the bottom surface is strengthened significantly, a larger radial angle is usually taken. Consequently, the width of the equivalent ground conductor 66 should be smaller than its length in the radial direction so as to be shaped along the radial direction. Consequently, the connecting conductors 65 and 65' in the circumferential direction is set shorter than their length in the radial direction so as to increase the center angle (radial angle) of each of the radial conductors 64, 64' and 64".

Thus, since the equivalent ground conductor 66 is constituted by providing a plurality radial conductors 64, 64' and 64" and electrically connecting the radial conductors 64, 64' and 64" with each other using the connecting conductors 65 and 65', the path of the current flowing from end to end in the radial circumferential direction of the radial conductors 64, 64' and 64" becomes longer than when the equivalent ground conductor is composed of only a single equivalent ground conductor. Accordingly the frequency of the path corresponding to one wavelength is lowered and the frequency with which the charge density distribution on the radial stub becomes standing distribution is moved toward the low frequency side. However, since the charge density distribution becomes a standing distribution such way, it is most effective to set the center angle of each of the equivalent ground conductors so that the center angle of each equivalent ground conductor is separated from others where the current density is high in a single equivalent ground conductor.

Figure 5:
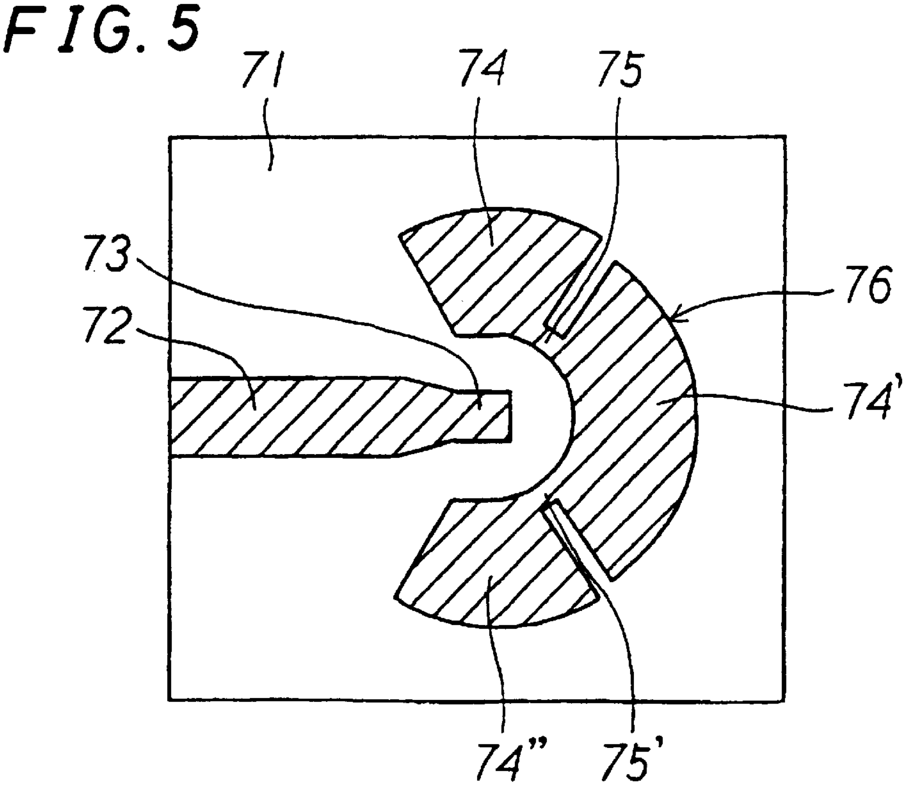
FIG. 5 is a top view indicating another embodiment of the high-frequency wave measurement substrate according to the fifth aspect of the present invention.

FIG. 5 is a top view of another embodiment of the high-frequency wave measurement substrate according to the fifth aspect of the invention. The substrate is formed as follows. At first, a ground conductor is formed almost all over the bottom surface of an dielectric substrate 71 and a microstrip line signal conductor 72 is formed on the top surface of the dielectric substrate 71. The tip of this signal conductor 72 forms a coplanar line portion signal conductor 73 electrically connected to the conductor 72. The coplanar line portion signal conductor 73 serves as a part which brings a signal conductor of a coplanar line structure wafer probe (not illustrated) into contact with the microstlip line signal conductor 72 to electrically connect them to each other.

Radial conductors 74, 74' and 74" are then formed around the tip of the microstrip line signal conductor 72 with an approximate semi-circular or fan-shaped conductor pattern and disposed like an arc, sharing the center with each other. In this embodiment, the center radial conductor 74' is formed longer in the radial direction than other radial conductors 74 and 74" disposed at both sides of the conductor 74'. Furthermore, the center angle of each of the outside radial conductors 74 and 74" is set to about ½ of the center angle of the conductor 74'.

The radial conductors 74, 74' and 74" are connected electrically to each other using the connecting conductors 75 and 75'. Each of the connecting conductors 75 and 75' is composed of the same conductor as that of the radial conductors 74, 74' and 74". The radial conductors 75 and 75' are formed shorter than the radial conductors 74, 74' and 74" in the radial direction. In this embodiment, the length of each of the connecting conductors 75 and 75' is ½ of that of the radial conductors 74, 74' and 74" or under in the radial direction. The connecting conductors 75 and 75' are used to connect the radial conductors 74, 74' and 74" at their inner peripheries.

The approximate radial-stub-like equivalent ground conductor 76 is composed of the radial conductors 74, 74' and 74", as well as the connecting conductors 75 and 75'.

Figure 6:
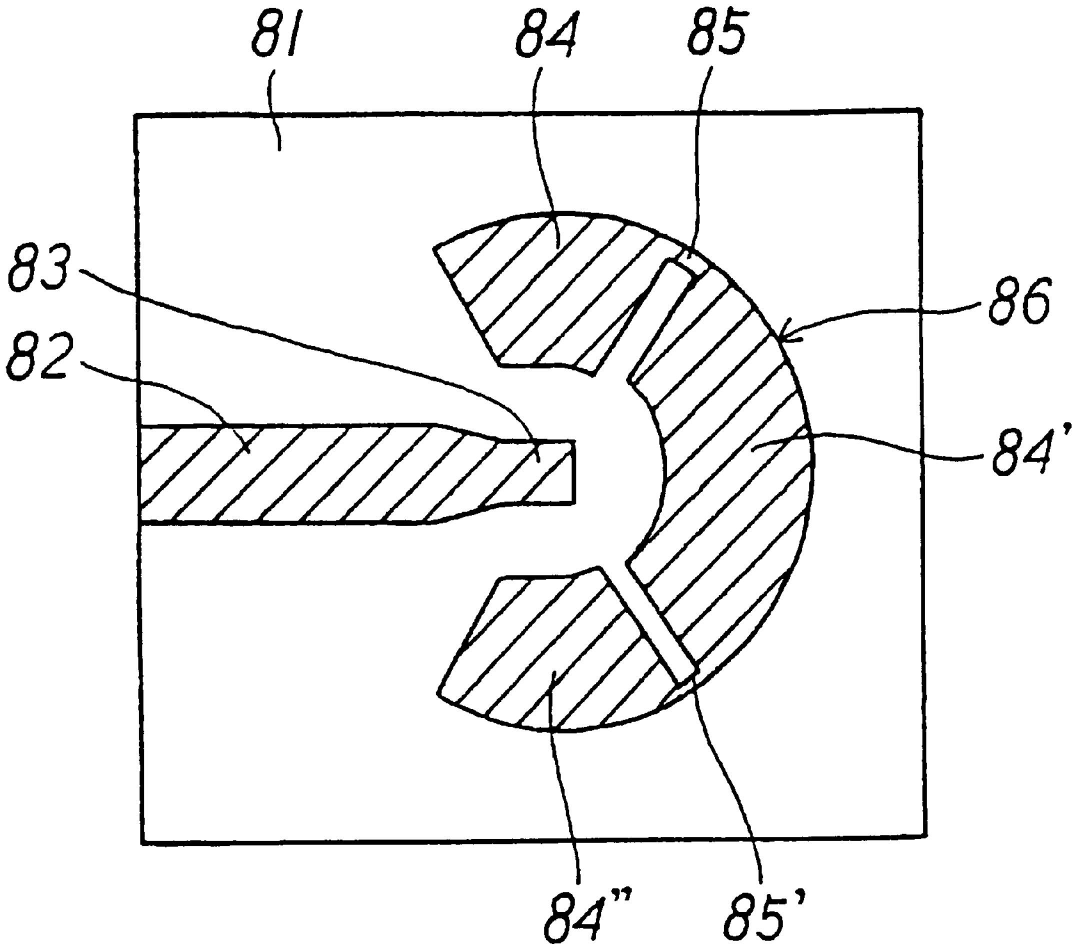
FIG. 6 is a top view indicating a still another embodiment of the high-frequency wave measurement substrate according to the fifth aspect of the present invention.

FIG. 6 is a top view of still another embodiment of the high-frequency wave measurement substrate according to the fifth aspect of the invention. The substrate is formed as follows. At first, a ground conductor is formed almost all over the bottom surface of an dielectric substrate 81 and a microstrip line signal conductor 82 is formed on the top surface of the dielectric substrate 81. The tip of this signal conductor 82 forms a coplanar line portion signal conductor 83 electrically connected to the conductor 82. The coplanar line portion signal conductor 83 serves as a part which brings a signal conductor of a coplanar line structure wafer probe (not illustrated) into contact with the microstlip line signal conductor 82 to electrically connect them to each other.

Around the tip of the microstrip line signal conductor 82 are formed radial conductors 84, 84' and 84" with an approximate semi-circular or fan-shaped conductor pattern respectively and disposed like an arc, sharing the center with each other. In this embodiment, the center radial conductor 84' is formed shorter in the radial direction than other radial conductors 84 and 84" disposed at both sides of the conductor 84'. Furthermore, the center angle of each of the outside radial conductors 84 and 84" is set to about ½ of the center angle of the conductor 84'.

The radial conductors 84, 84' and 84" are connected electrically to each other via the connecting conductors 85 and 85'. Each of the connecting conductors 85 and 85' is composed of the same conductor as that of the radial conductors 84, 84' and 84". The radial conductors 85 and 85' are formed shorter than the radial conductors 84, 84' and 84" in the radial direction. In this embodiment, the length of each of the connecting conductors 85 and 85' is ½ of that of the radial conductors 84, 84' and 84" or under in the radial direction. The connecting conductors 85 and 85' are used to connect the radial conductors 84, 84' and 84" at their outer peripheries.

The equivalent ground conductor 86 shaped like an approximate radial stub is composed of those radial conductors 84, 84' and 84", as well as the connecting conductors 85 and 85'.

Next, description will be made concretely for the relationship between the thickness h and the relative dielectric constant $\epsilon_r$ of each of the dielectric substrates 31, 41, 51, 61, 71, and 81 in each of the high-frequency wave measurement substrates described above.

As shown in FIG. 2, a metallic film is coated almost all over the bottom surface of an dielectric substrate 41 made of alumina ceramics whose relative dielectric constant is 9.6. Then, on the top surface of the dielectric substrate 41 is formed a microstrip line signal conductor 42 with the same metallic film. After this, a coplanar line portion 43 is formed ft the tip of the signal conductor 42 at a distance of 105 $\mu$m from the center of the signal conductor 42 to the ground conductor. The coplanar line portion 43 is then connected to the tip of the microstrip line signal conductor 42 electrically.

Furthermore, a fan-shaped radial stub is formed as an equivalent ground conductor 44 closely to the coplanar line portion signal conductor 43 (tip of the microstrip line signal conductor 42). A mid-point of the signal conductor in the width direction is assumed as the center of the radial stub on conditions of an inner diameter of 105 μm, an outer diameter of 400 μm, and a center angle of 260°. After this, notch-like non-conductor areas 45 and 45' are formed in part of the fan-shaped radial-stub-like equivalent ground conductor 44 in the radial direction. The areas 45 and 45' have a width of 30 μm in the circumferential direction at about ¼ and ¾ of the center angle of the equivalent ground conductor, respectively. A 30 μm wide innermost peripheral conductor portion is left as is.

After this, in order to check how the characteristics of each substrate is varied when the thickness h is changed, samples B, C, D, E, and F were manufactured as embodiments of the present invention and comparing samples A and G were manufactured, premising that the signal line widths of both microstrip line (MSL) and coplanar line (CPW) were as shown in Table L with respect to the thickness h.

Table 1 also shows $h\sqrt{\epsilon_r}$ of each of the samples A to G.

TABLE 1

| Sample | Substrare Thickness h (μm) | MSL Signal Line Width (μm) | CPW Signal Line Width (μm) | $h\sqrt{\epsilon_r}$ (μm) |
|---|---|---|---|---|
| *A | 50 | 45 | 45 | 155 |
| B | 75 | 70 | 65 | 232 |
| C | 100 | 95 | 75 | 310 |
| D | 125 | 120 | 85 | 387 |
| E | 150 | 150 | 90 | 465 |
| F | 175 | 180 | 95 | 542 |
| *G | 200 | 210 | 95 | 620 |

*indicates a sample that is not included in any embodiments of the present invention.

An electromagnetic field simulation was performed to extract the characteristics of each of the samples A to G according to the frequency applied from the end of the microstrip, which is not connected to the coplanar line to the end of the coplanar line, which is not connected to the microstrip line. A reflection coefficient $S_{11}$ and a transmission coefficient $S_{21}$ were obtained from the extracted characteristics as its frequency characteristics. The $S_{11}$ and $S_{21}$ were used as evaluation indexes for the amount of transmitted signals of all the entered signals.

Figure 7:
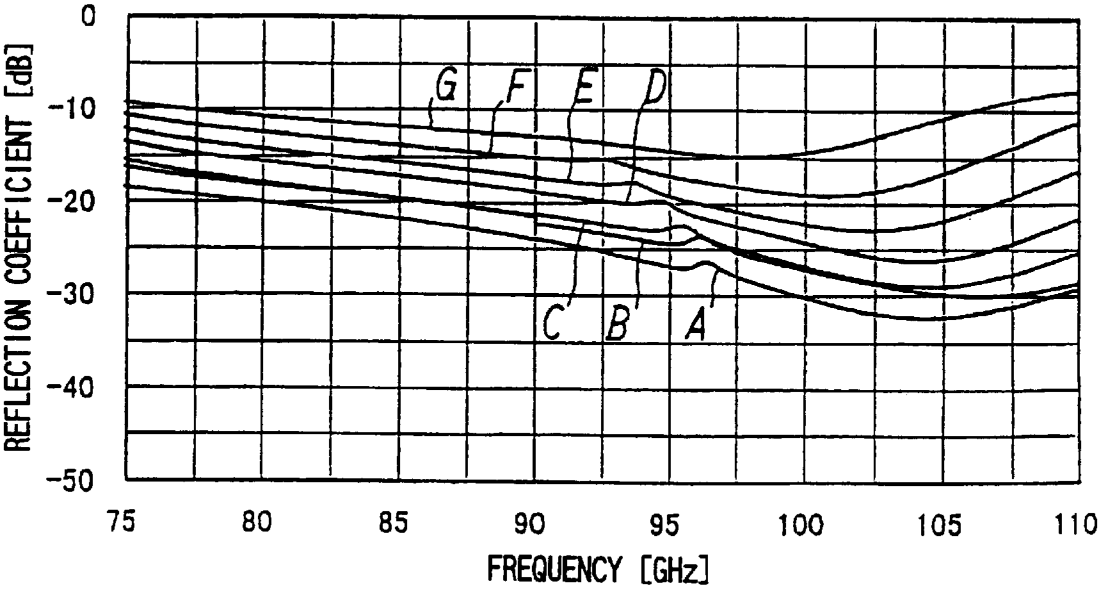
FIG. 7 is a diagram indicating reflection characteristics to frequency when the thickness of the substrate in the high-frequency wave measurement substrate is changed.

FIG. 7 shows a diagram of frequency characteristics of each reflection coefficient $S_{11}$ for comparing transmission characteristics of each sample with those of others. In FIG. 7, the lateral axis indicates frequencies in units of GHz and the ordinate axis indicates the amount of reflected signals in units of dB. Each of the characteristic curves A to G indicates frequency characteristics of each of the samples A to G.

Figure 8:
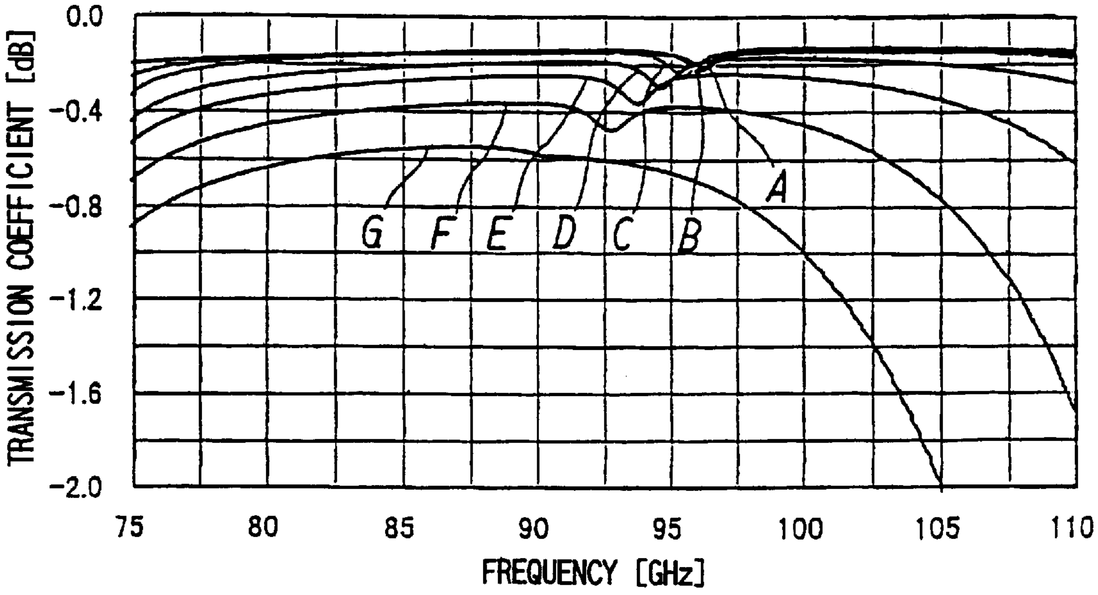
FIG. 8 is a diagram indicating transmission characteristics to frequency when the thickness of the substrate in the the high-frequency wave measurement substrate is changed.

FIG. 8 shows a diagram of frequency characteristics of each transmission coefficient $S_{21}$ for comparing the transmission characteristics of each of the samples A to G with others. In FIG. 8, the lateral axis indicates frequencies in units of GHz and the ordinate axis indicates the amount of transmitted signals in units of dB. Each of the characteristic curves A to G indicates the frequency characteristics of each of the samples A to G.

As understood from these results of comparison, each of the high-frequency wave measurement substrate samples B to F is composed of a ground conductor formed almost all over the bottom surface of a dielectric substrate, as well as a microstrip line signal conductor and a semi-circular or fan-shaped radial-stub-like equivalent ground conductor formed on the top surface of the dielectric substrate. The equivalent ground conductor is formed around the tip of the signal conductor. The high-frequency wave measurement substrate is used to connect a coplanar line structure wafer probe signal conductor and a ground conductor electrically to the signal conductor and the equivalent ground conductor formed as described above. The product $h\sqrt{\epsilon_r}$ of the thickness h of the dielectric substrate and the square root of the relative dielectric constant $\epsilon_r$ of the dielectric materials is assumed to be within a range of from 1/12 to 1/5 (included) ($\lambda_{max}/12 \leqq h\sqrt{\epsilon_r} \leqq \lambda_{max}/5$) of the vacuum wavelength of the measurement upper limit frequency $\lambda_{max}$. In other words, the product $h\sqrt{\epsilon_r}$ is assumed to be within a range of from 1/12 (about 227 μm) to 1/5 (included) (about 545 μm) of the vacuum wavelength λ(110 GHz) (about 2.72 mm) of the measurement upper limit frequency 110 GHz in this embodiment. Consequently, the reactance value in the radial-stub-like equivalent ground conductor is reduced, thereby the equivalent ground is stabilized to suppress the high-order transmission and reduce the transmission loss as much as possible. And accordingly, the low loss transmission frequency band is expanded.

It is found that if the product $h\sqrt{\epsilon_r}$ of the thickness h of the dielectric substrate and the square root of the relative dielectric constant $\epsilon_r$ of the dielectric materials is 1/5 or over, the ($h\sqrt{\epsilon_r} < \lambda_{max}/5$) sample G is confronted with a problem that the low loss transmission frequency band is narrowed with an increase of transmission loss caused by the high-order mode. In addition, if the $h\sqrt{\epsilon_r}$ is below 1/12 of A the ($h\sqrt{\epsilon_r} < \lambda_{max}/12$) sample A has almost the same performance as that of the sample B. However, since the substrate is so thin that it is difficult lo manufacture it. Thus, it has been difficult to obtain such samples stably.

It was also found that the best sample was B, since its reactance value was the smallest among those samples. In addition, the sample substrate was not so thin and not so difficult to be manufactured.

According to the high-frequency wave measurement substrate of the invention, therefore, it was confirmed from the above results that because the product $h\sqrt{\epsilon_r}$ of the thickness h of the dielectric substrate and the square root of the relative dielectric constant $\epsilon_r$ of the dielectric materials was set to be within a range of from 1/12 to 1/5 (included) ($\lambda_{max}/12 \leqq \sqrt{\epsilon_r} \leqq \mu_{max}/5$) of the vacuum wavelength $\lambda_{max}$ of the measurement upper limit frequency, the reactance value in the radial-stub-like equivalent ground conductor was reduced, thereby the low loss transmission frequency band could be secured widely. The invention thus provides a high-frequency wave measurement substrate provided with low loss characteristics in a wade range.

The above results were confirmed even in the case of the high-frequency wave measurement substrates shown in FIG. 1, and FIG. 3 to FIG. 6.

Next, description will be made for the high-frequency wave measurement substrate of the present invention concretely using both an embodiment of the present invention and a comparing example.

COMPARATIVE EXAMPLE 1

Figure 15:
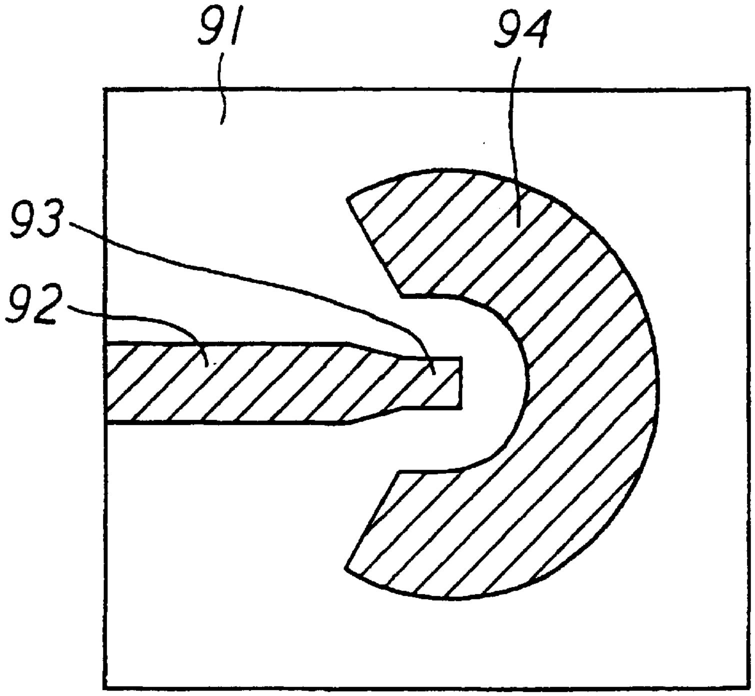
FIG. 15 Prior art
FIG. 15 is a top view indicating a conventional high-measurement substrate of a comparative example.
Figure 16:
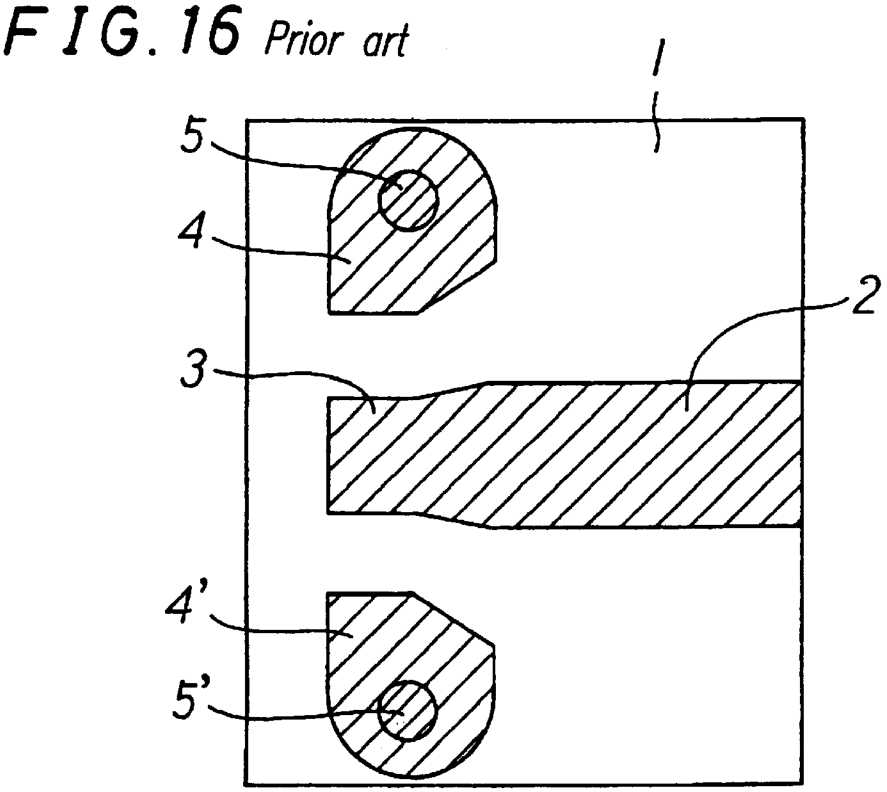
FIG. 16 Prior art
FIG. 16 is a top view indicating an embodiment of a prior frequency wave measurement substrate.
Figure 17:
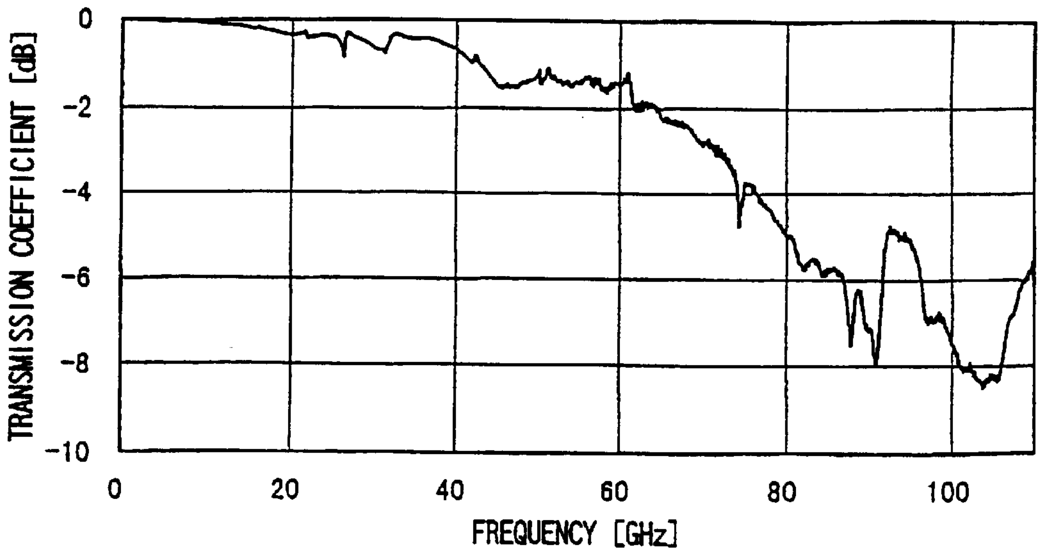
FIG. 17 Prior art
FIG. 17 is a diagram indicating transmission characteristics to frequency in the high-frequency wave measurement substrate shown in FIG. 16.
Figure 18:
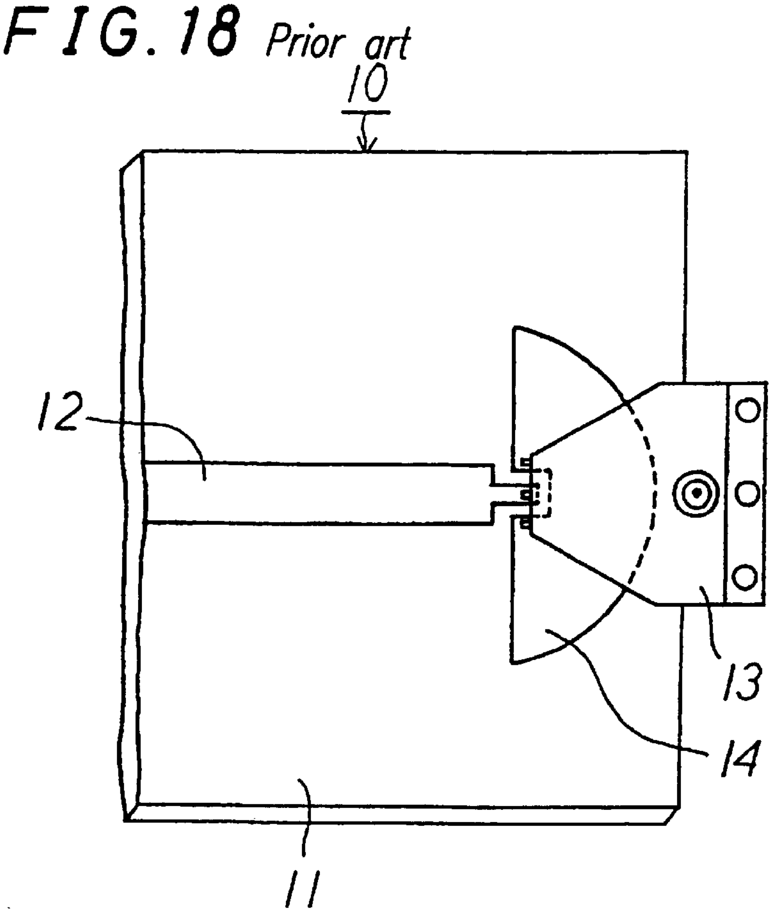
FIG. 18 Prior art
FIG. 18 is a top view indicating another embodiment of a art high-frequency wave measurement substrate.
Figure 19:
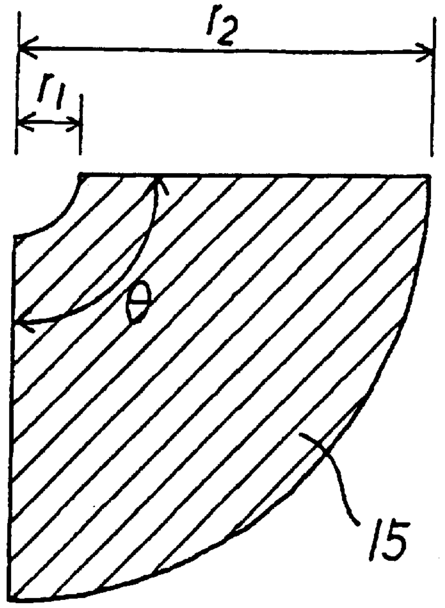
FIG. 19 Prior art
FIG. 19 is a top view indicating an example of a radial stub.
Figure 20:
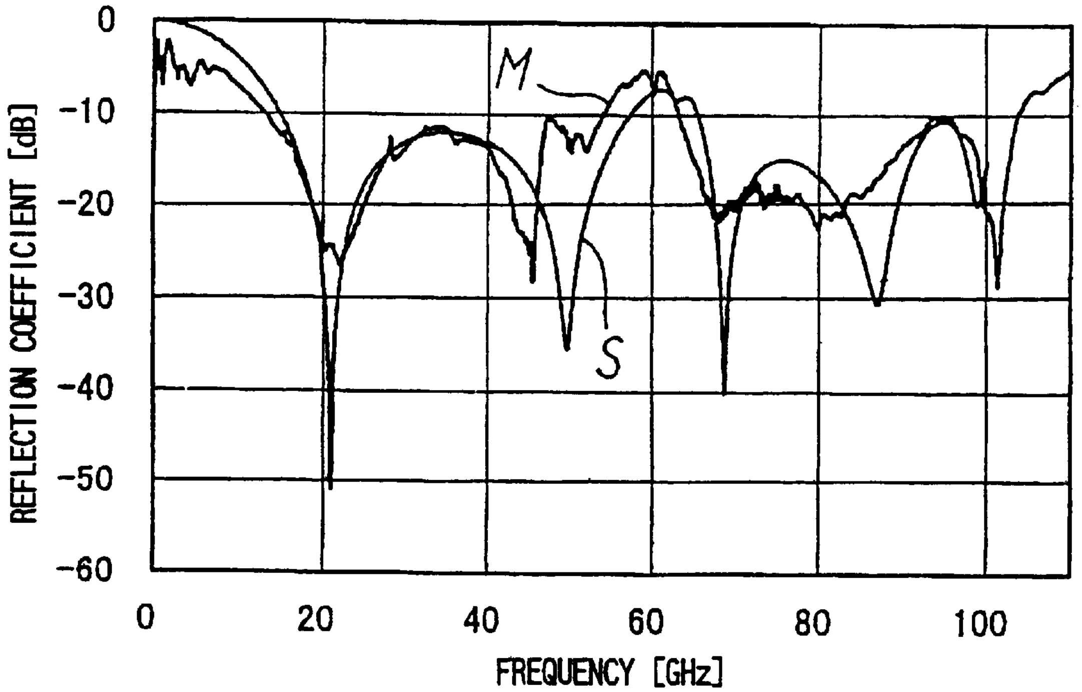
FIG. 20 Prior art
FIG. 20 is a diagram view indicating reflection characteristics to frequency in the high-frequency wave measurement substrate shown in FIG. 22.
Figure 21:
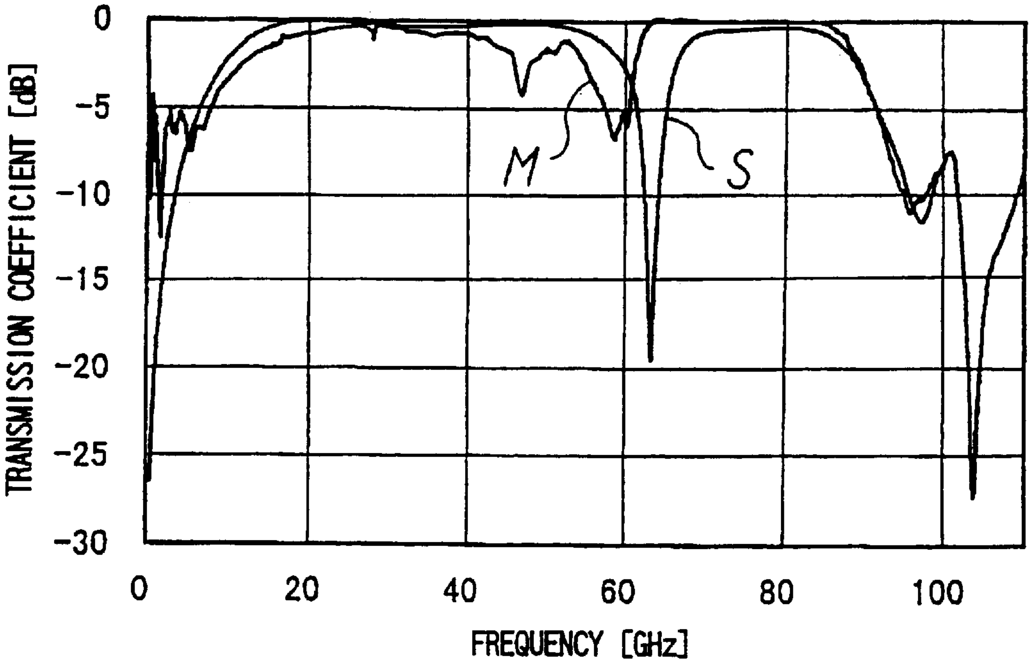
FIG. 21 Prior art
FIG. 21 is a diagram indicating transmission characteristics to frequency in the high-frequency wave measurement substrate shown in FIG. 22.
Figure 22:
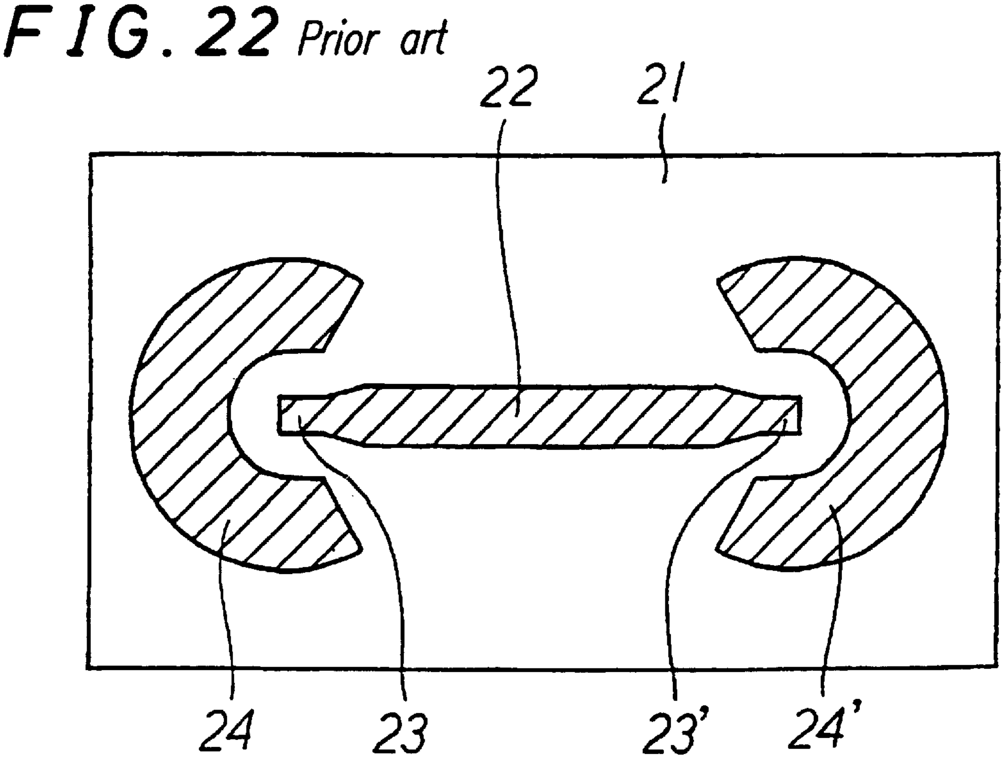
FIG. 22 Prior art
FIG. 22 is a top view of another embodiment of the conventional high-frequency wave measurement substrate.

FIG. 15 shows a top view of a conventional high-frequency wave measurement substrate. The substrate is formed as follows: At first, a ground conductor is formed almost all over the bottom surface of an dielectric substrate 91 and a microstrip line signal conductor 92 is formed on the top surface of the dielectric substrate 91. The tip of this signal conductor 92 forms a coplanar line portion signal conductor 93 electrically connected to the conductor 92. And, around the coplanar line portion signal conductor 93 is provided an equivalent ground conductor 94 formed with a conductor pattern.

The dielectric substrate 91 was made of alumina ceramics. The specific conductive factor of the substrate 91 was 9.6 and the thickness was 200 μm. A metallic film consisting of Cr/Cu/Ni/Au was then coated almost all over the bottom surface of the substrate 91. On the top surface of the dielectric substrate 91 was formed a microstrip line signal conductor 92 having a width of 190 μm. Then, at the tip of the conductor 92 was formed a coplanar line portion 93 so as to have a width of 160 μm and the gap of 135 μm between the signal conductor and the ground conductor. The coplanar line portion 93 was connected to the tip of the microstrip line signal conductor 92 electrically. Then, a fan-shaped radial stub was formed as an equivalent ground conductor 94 closely to the coplanar line portion signal conductor 93 (tip of the microstrip line signal conductor 92). A mid-point of the signal conductor in the width direction was assumed as the center of the radial stub of 215 μm in inner diameter, 580 μm in outer diameter, and 230° in center angle. The related art high-frequency wave measurement substrate sample H was thus prepared.

Embodiment 1

In the same process as that of the samples H, the high-frequency wave measurement substrate sample I of the present invention was manufactured as follows. At first, two notch-like non-conductor areas 35 and 35' were formed in part of the fan-shaped radial-stub-like equivalent ground conductor 34 as shown in FIG. 1 in the radial direction. The areas 35 and 35' had a width of 5° in the circumferential direction at a position about ¼ and about ¾ of the center angle of the equivalent ground conductor 34, respectively. A 20 μm wide conductor portion at the outermost periphery of the equivalent ground conductor 34 was left. High-frequency wave measurement substrate sample I was thus prepared.

An electromagnetic field simulation was then performed to extract the characteristics of each of the samples H and I according to the frequency applied from the end of the microstrip, which is not connected to the coplanar line to the end of the coplanar line, which is not connected to the microstrip line. A transmission coefficient $S_{21}$ were thus obtained from the extracted characteristics as its transmission characteristics of the object frequency.

Figure 9:
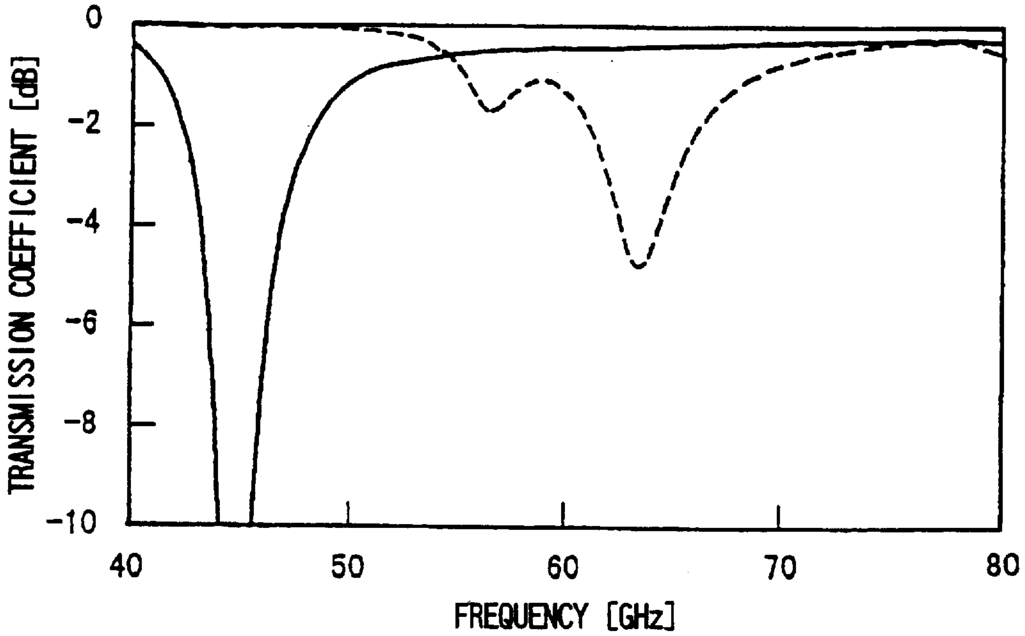
FIG. 9 is a diagram indicating transmission characteristics to frequency in a high-frequency wave measurement substrate of embodiment 1.

FIG. 9 shows a diagram of frequency characteristics of the transmission coefficient $S_{21}$ for each of the samples H and I. In FIG. 9, the lateral axis indicates frequencies in units of GHz and the ordinate axis indicates transmission coefficients in units of dB. The characteristic curve of the sample I is indicated with a solid line and the characteristic curve of the sample H is indicated with a broken line.

As understood from the above results, according to the sample I of the high-frequency wave measurement substrate of the present invention, predetermined non-conductor areas are formed in part of the fan-shaped radial-stub-like equivalent ground conductor, so that the resonant frequency is moved toward the low frequency side more effectively than the sample H of the related art high-frequency wave measurement substrate, iii which no non-conductor area is provided. Consequently, the low frequency side of the low loss frequency band is expanded, so that the high-frequency wave measurement substrate of the present invention can have favorable wide band low loss transmission characteristics. Especially, according to the shape of the sample I, the path that generates a charge density distribution becomes longest. Consequently, the shape of the sample I causes the discharge density to be varied significantly and the resonant frequency could be moved toward the low frequency side very effectively.

According to the high-frequency wave measurement substrate of the invention, therefore, since predetermined non-conductor areas are provided in part of the radial-stub-shaped equivalent ground conductor, the resonant frequency is moved to the low frequency side effectively. As a result, it was confirmed that the high-frequency wave measurement substrate could have satisfactory wide band low loss transmission characteristics.

Embodiment 2

In the same process as that of the sample H, the sample J of the high-frequency wave measurement substrate of the invention was manufactured as follows: Notch-like non-conductor areas 45 and 45' were formed in part of the fan-shaped radial-stub-like equivalent ground conductor 44 as shown in FIG. 2. The areas 45 and 45' formed in the radial direction had a width of 5° in the circumferential direction at a position of ¼ and ¾ of the center angle of the equivalent ground conductor 44, respectively. A 20 μm wide innermost peripheral portion of the conductor was left as was.

The extraction of characteristics from the samples H and J was carried out in the same manner as that of the embodiment 1, and a transmission coefficient $S_{21}$ was obtained from the extracted characteristics as an evaluation index for the amount of transmitted signals of all the entered signals, respectively. The obtained transmission coefficient $S_{21}$ indicates the transmission characteristics of the object frequency.

Figure 10:
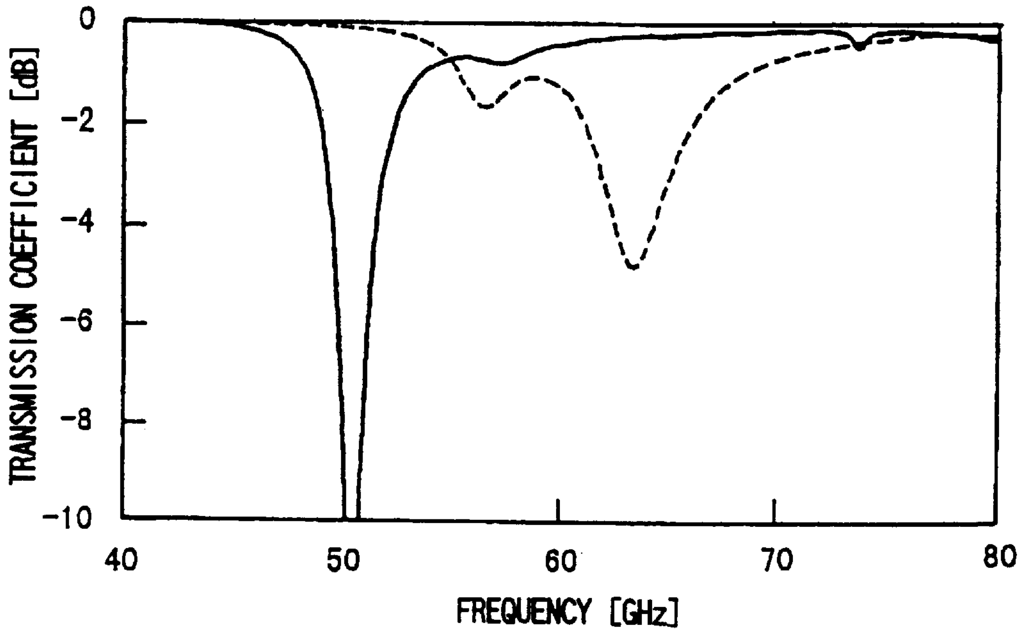
FIG. 10 is a diagram indicating the transmission characteristics to frequency in a high-frequency wave measurement substrate of embodiment 2.

FIG. 10 shows a diagram of the comparison of the characteristics between samples H and J with respect to those results. In FIG. 10, the lateral axis indicates frequencies in units of GHz and the ordinate axis indicates the amount of transmitted signals in units of dB. The solid line is the characteristic curve of $S_{21}$ for the sample J and a broken line is a characteristic curve of $S_{21}$ of the sample H.

As understood from the above results, according to the sample J of the high-frequency wave measurement substrate of the present invention, predetermined non-conductor areas are formed in part of the fan-shaped radial-stub-like equivalent ground conductor, so that the resonant frequency is moved toward the low frequency side more effectively than the sample H of the related art high-frequency wave measurement substrate, in which no non-conductor area is provided. Consequently, the low frequency side of the low loss frequency band is expanded, so that the high-frequency wave measurement substrate of the present invention can have favorable wide band low loss transmission characteristics. According to the sample J, when compared with the sample I, the sample J resonates at a position a little toward the high-frequency side. This is because of a difference of the length of the path which generates a charge density distribution between the samples J and I. Consequently, it was confirmed that the distance of the movement of the resonant frequency could be set to a predetermined value in accordance with the shape of the non-conductor areas.

According to the high-frequency wave measurement substrate of the invention, therefore, since predetermined non-conductor areas are provided in part of the radial-stub-shaped equivalent ground conductor, the resonant frequency is moved to the low frequency side. It was thus confirmed that the high-frequency wave measurement substrate could have satisfactory wide band low loss transmission characteristics.

Embodiment 3

In the same process as that of the sample H, the sample K of the high-frequency wave measurement substrate of the invention was manufactured as follows. At first, rectangular non-conductor areas 55 and 55' were formed in part of the fan-shaped radial-stub-like equivalent ground conductor 54 in the radial direction. The areas 55 and 55' had a width of 5° in the circumferential direction of ¼ and ¾ of the center angle of the equivalent ground conductor 54, respectively, as shown in FIG. 3. A 20 μm wide innermost and a 20 μm wide outermost peripheral portions of the conductor were left as were.

The extraction of characteristics from the samples H and K was carried out in the same manner as that of embodiment 1. After this, a transmission coefficient $S_{21}$ was obtained from the extracted characteristics as an evaluation index for the amount of transmitted signals of all the entered signals, respectively. The obtained transmission coefficient $S_{21}$ indicates the transmission characteristics of the object frequency.

Figure 11:
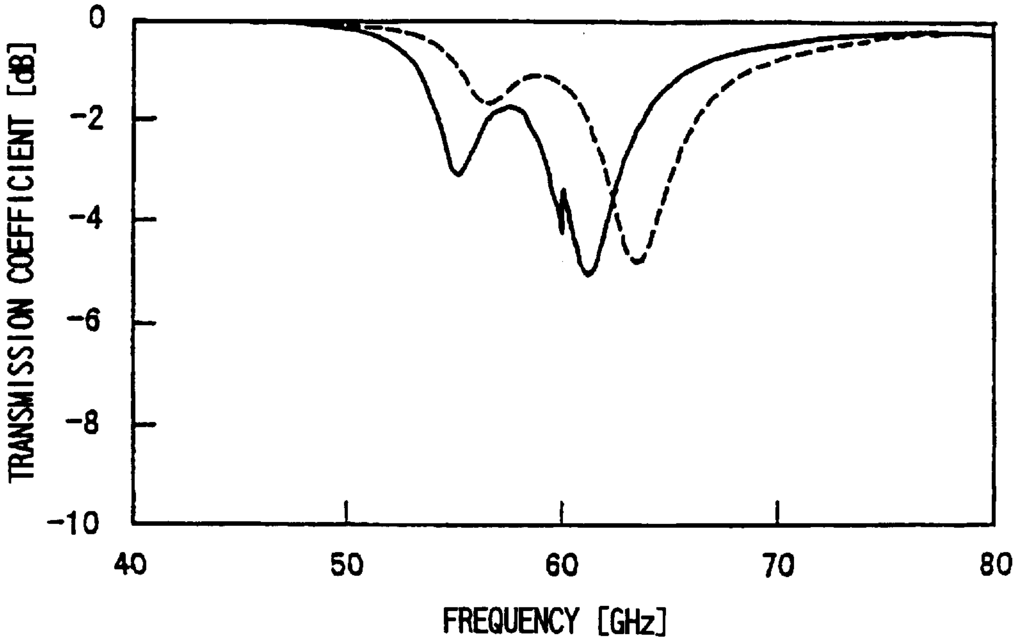
FIG. 11 is a diagram indicating the transmission characteristics to frequency in a high-frequency wave measurement substrate of embodiment 3.

FIG. 11 shows a diagram of the comparison of the characteristics between samples H and K with respect to those results. In FIG. 11, the lateral axis indicates frequencies in units of GHz and the ordinate axis indicates the amount of transmitted signals in units of dB. The solid line is the characteristic curve of $S_{21}$ for the sample K and a broken line is a characteristic curve of $S_{21}$ of the sample H.

As understood from the above results, according to the sample K of the high-frequency wave measurement substrate of the present invention, predetermined non-conductor areas are formed in part of the fan-shaped radial-stub-like equivalent ground conductor, so that the resonant frequency is moved toward the low frequency side more effectively than the sample H of the related art high-frequency wave measurement substrate, in which no non-conductor area is provided. Consequently, the low frequency side of the low loss frequency band is expanded, so that the high-frequency wave measurement substrate of the present invention can have satisfactory wide band low loss transmission characteristics. Furthermore, according to the sample K, when compared with the samples I and J, the sample K resonates at a position a little toward the high-frequency side. This is because of a difference of the length of the path which generates a charge density distribution between the sample K and the samples I and J. Consequently, it was confirmed that the movement distance of the resonant frequency could be set to a predetermined value in accordance with the shape of the object non-conductor areas.

According to the high-frequency wave measurement substrate of the present invention, therefore, since predetermined non-conductor areas are provided in part of the radial-stub-like equivalent ground conductor, the resonant frequency is moved to the low frequency side. As a result, it was confirmed that the high-frequency wave measurement substrate could have satisfactory wide band low loss transmission characteristics.

Embodiment 4

In the same process as that of the above samples, the sample L of the high-frequency wave measurement substrate of the present invention was manufactured as follows. The center angles of the fan-shaped radial conductors 64, 64' and 64" were set to 110° for the center conductor 64' and 55° for the outside conductors 64 and 64". The lengths of those conductors 64, 64' and 64" in the radial direction were set to 415 μm (inner diameter: 215 μm, outer diameter: 630 μm) for the center conductor 64' and 365 μm (inner diameter: 215 μm, outer diameter: 580 μm) for the outside conductors 64 and 64". And, the conductors 64, 64' and 64" were connected electrically to each other at their inner peripheries via the connecting conductors 65 and 65' so that a gap of 5° is formed between those radial conductors 64, 64' and 64". Each of the connecting conductors 65 and 65' was 20 μm in length in the radial direction and about 20 μm in length in the circumferential direction.

The extraction of characteristics from the samples H and L was carried out in the same manner as that of the embodiment 1. After this, a transmission coefficient $S_{21}$ was obtained from the extracted characteristics as an evaluation index for the amount of transmitted signals of all the entered signals. The obtained transmission coefficient $S_{21}$ indicates the transmission characteristics of the object frequency.

Figure 12:
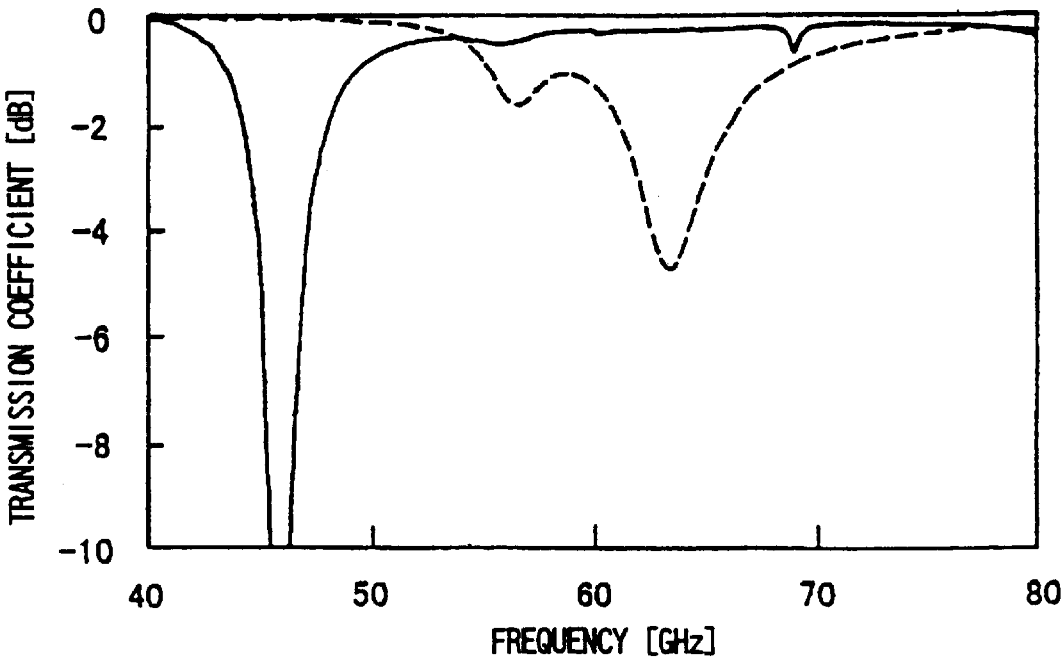
FIG. 12 is a diagram indicating the transmission characteristics to frequency in a high-frequency wave measurement substrate of embodiment 4.

FIG. 12 shows a diagram of the comparison of the characteristics between samples H and L with respect to those results. In FIG. 12, the lateral axis indicates frequencies in units of GHz and the ordinate axis indicates the amount of transmitted signals in units of dB. The solid line is the characteristic curve of $S_{21}$ for the sample L and a broken line is the characteristic curve of $S_{21}$ of the sample H.

As understood from the above results, according to the sample L of the high-frequency wave measurement substrate of the present invention, the equivalent ground conductor is composed of a plurality of radial conductors connected to each other electrically via connecting conductors, so that the resonant frequency is moved toward the low frequency side more effectively than the sample H of the related art high-frequency wave measurement substrate composed of only a single radial equivalent ground conductor. Consequently, the low frequency side of the low loss frequency band is expanded, so that the high-frequency wave measurement substrate of the present invention can have satisfactory wide band low loss transmission characteristics.

According to the high-frequency wave measurement substrate of the invention, therefore, since the equivalent ground conductor is composed of a plurality of radial conductors connected to each other electrically via connecting conductors, the resonant frequency is moved to the low frequency side effectively. As a result, it could be confirmed that the high-frequency wave measurement substrate could have satisfactory wide band low loss transmission characteristics.

Embodiment 5

The sample M of the high-frequency wave measurement substrate of the invention was manufactured as follows in the same process as that of the sample H. The center angles of the fan-shaped radial conductors 74, 74' and 74" were set to 110° for the center conductor 74' and 55° for the outside conductors 74 and 74". The lengths of those conductors 74, ,74' and 74" in the radial direction were set to 365 μm (inner diameter: 215 μm, outer diameter: 580 μm) for the center conductor 74' and 415 μm (inner diameter: 215 μm, outer diameter: 630 μm) for the outside conductors 74 and 74". And, the conductors 74, 74' and 74" were connected electrically to each other at their inner peripheries via the connecting conductors 75 and 75' so that a gap of 5° is formed between those radial conductors 74, 74' and 74". Each of the connecting conductors 75 and 75' was 20 μm in length in the radial direction and about 20 μm in length in the circumferential direction.

The extraction of characteristics from the samples H and M was carried out in the same manner as that of the embodiment 1, and a transmission coefficient $S_{21}$ was obtained from the extracted characteristics as an evaluation index for the amount of transmitted signals of all the entered signals. The obtained transmission coefficient $S_{21}$ indicates the transmission characteristics of the object frequency.

Figure 13:
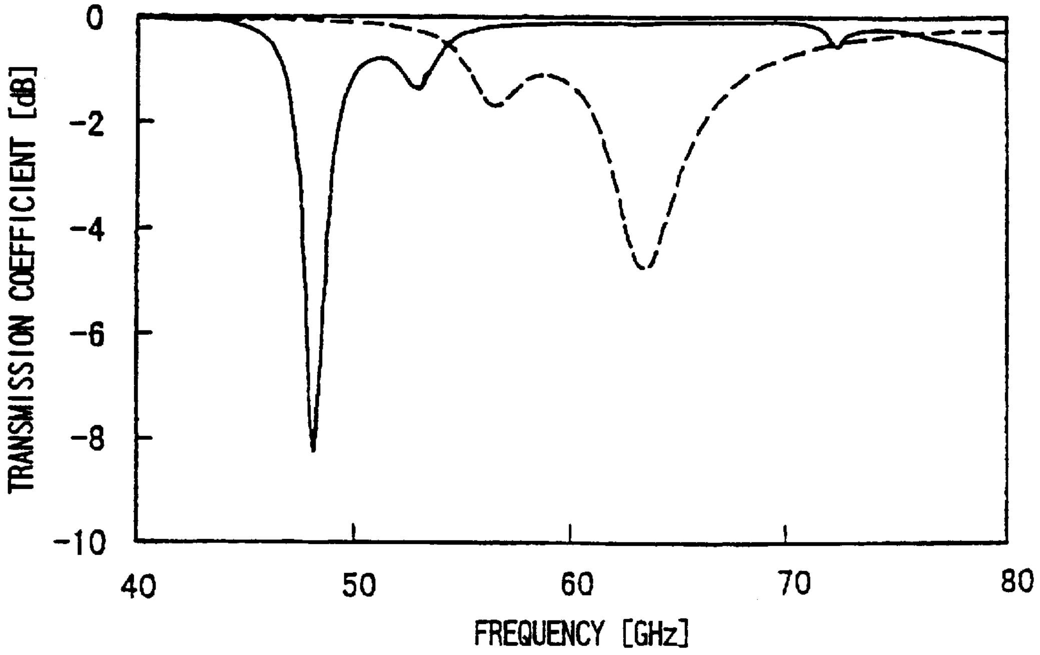
FIG. 13 is a diagram indicating the transmission characteristics to frequency in a high-frequency wave measurement substrate of embodiment 5.

FIG. 13 shows a diagram of the comparison of the characteristics between samples H and M with respect to those results. In FIG. 13, the lateral axis indicates frequencies in units of GHz and the ordinate axis indicates the amount of transmitted signals in units of dB. The solid line is the characteristic curve of $S_{21}$ for the sample M and a broken line is the characteristic curve of $S_{21}$ of the sample H.

As understood from the above results, according to the sample M of the high-frequency wave measurement substrate of the present invention, the equivalent ground conductor is composed of a plurality of radial conductors connected to each other electrically via connecting conductors, so that the resonant frequency is moved toward the low frequency side more effectively than the sample H of the related art high-frequency wave measurement substrate composed of only a single radial equivalent ground conductor. Consequently, the low frequency side of the low loss frequency band is expanded, so that the high-frequency wave measurement substrate of the present invention can have satisfactory wide band low loss transmission characteristics.

According to the sample M, when compared with the sample L, the sample M resonates at a position a little toward the high-frequency side. This is because of a difference of the length of the path which generates a charge density distribution between the samples M and L. Consequently, it was confirmed that the distance of the movement of the resonant frequency could be set to a predetermined value in accordance with the shape of the non-conductor areas.

According to the high-frequency wave measurement substrate of the invention, therefore, since the equivalent ground conductor is composed of a plurality of radial conductors connected to each other electrically via connecting conductors, the resonant frequency is moved to the low frequency side effectively. As a result, it was confirmed that the high-frequency wave measurement substrate could have satisfactory wide band low loss transmission characteristics.

Embodiment 6

The sample N of the high-frequency wave measurement substrate of the invention was manufactured as follows in the same process as that of the sample H. The center angles of the fan-shaped radial conductors 84, 84' and 84" were set to 110° for the center conductor 84' and 55° for the outside conductors 84 and 84". The lengths of those conductors 84, 84' and 84" in the radial direction were set to 365 μm (inner diameter: 265 μm, outer diameter: 630 μm) for the center conductor 84' and 415 μm (inner diameter: 215 μm, outer diameter: 630 μm) for the outside conductors 84 and 84". And, the conductors 84, 84' and 84" were connected electrically to each other at their inner peripheries via connecting conductors 85 and 85' so that a gap of 5° is formed between those radial conductors 84, 84' and 84". Each of the connecting conductors 85 and 85' was 20 μm in length in the radial direction and about 20 μm in length in the circumferential direction.

The extraction of characteristics from the samples H and N was carried out in the same manner as that of the embodiment 1, and a transmission coefficient $S_{21}$ was obtained from the extracted characteristics as an evaluation index for the amount of transmitted signals of all the entered signals. The obtained transmission coefficient $S_{21}$ indicates the transmission characteristics of the object frequency.

Figure 14:
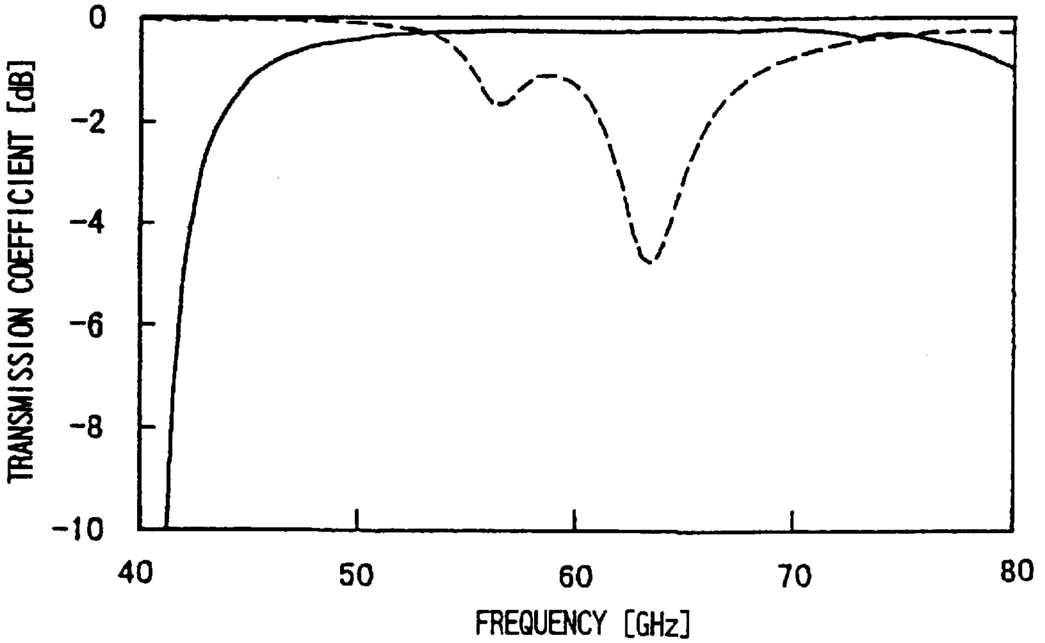
FIG. 14 is a diagram indicating the transmission characteristics to frequency in a high-frequency wave measurement substrate of embodiment 6.

FIG. 14 shows a diagram of the comparison of the characteristics between samples H and N with respect to those results. In FIG. 14, the lateral axis indicates frequencies in units of GHz and the ordinate axis indicates the amount of transmitted signals in units of dB. The solid line is the characteristic curve of $S_{21}$ for the sample N and a broken line is a characteristic curve of $S_{21}$ of the sample H.

As understood from the above results, according to the sample N of the high-frequency wave measurement substrate of the present invention, the equivalent ground conductor is composed of a plurality of radial conductors connected to each other electrically via connecting conductors, so that the resonant frequency is moved toward the low frequency side more effectively than the sample H of the related art high-frequency wave measurement substrate composed of only a single radial equivalent ground conductor. Consequently, the low frequency side in the low loss frequency band is expanded, so that the high-frequency wave measurement substrate of the present invention can have satisfactory wide band low loss transmission characteristics.

Especially, according to the sample N, since the sample N has the longest path that generates a charge density distribution, its shape causes the discharge distribution to be varied significantly. The resonant frequency could thus be moved towards the low frequency side very effectively.

According to the high-frequency wave measurement substrate of the present invention, therefore, since the equivalent ground conductor is composed of a plurality of radial conductors connected to each other electrically via connecting conductors, the resonant frequency is moved to the low frequency side very effectively. As a result, it was confirmed that the high-frequency wave measurement substrate could have satisfactory wide band low loss transmission characteristics.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed:

1. A high-frequency wave measurement substrate comprising:

a dielectric substrate, a ground conductor formed on a bottom surface of the dielectric substrate, a microstrip line signal conductor formed on a top surface of the dielectric substrate, a coplanar line portion signal conductor formed on the top surface of the substrate and electrically connected to the microstrip line signal conductor, and a semi-circular or fan-shaped radial-stub-like equivalent ground conductor formed on the top surface of the dielectric substrate and disposed in proximity to the coplanar line portion signal conductor, the ground conductor being electrically connected to the equivalent ground conductor, wherein a non-conductor area is provided in part of the fan shape in a radial direction, the equivalent ground conductor being a contiguous area.

2. The high-frequency wave measurement substrate of claim 1, wherein a length of the non-conductor area in the radial direction is equal to or more than a half of a width of the equivalent ground conductor in the radial direction.

3. The high-frequency wave measurement substrate of claim 1, wherein the non-conductor area is positioned at about ¼ or about ¾ of a center angle of the equivalent ground conductor.

4. The high-frequency wave measurement substrate of claim 1, wherein one end of the non-conductor area in the radial direction is opened to an inner or outer periphery of the equivalent ground conductor.

5. A high-frequency wave measurement substrate comprising:

a dielectric substrate, a ground conductor formed on a bottom surface of the dielectric substrate, a microstrip line signal conductor formed on a top surface of the dielectric substrate, a coplanar line portion signal conductor formed on the top surface of the substrate and electrically connected to the microstrip line signal conductor, and a radial-stub-like equivalent ground conductor formed on the top surface of the dielectric substrate and disposed in proximity to the coplanar line portion signal conductor, the ground conductor being electrically connected to the equivalent ground conductor, wherein the equivalent ground conductor is composed of a plurality of co-centric radial conductors disposed along an arc and having different widths in a radial direction, and a connecting conductor electrically connecting the radial conductors to each other.

6. The high-frequency wave measurement substrate of claim 5, wherein a length of the connecting conductor in the radial direction is equal to or less than a half of the length of the shortest radial conductor in the radial direction.

7. The high-frequency wave measurement substrate of claim 5, wherein a plurality of the radial conductors are divided into a center radial conductor to be disposed in the center and outside radial conductors disposed at both sides of the center radial conductor and the center angles of the outside radial conductors are about ½ of that of the center radial conductor respectively.

8. The high-frequency wave measurement substrate of claim 1 or 5, wherein a product of a thickness h of the substrate and a square root of a relative dielectric constant $\epsilon_r$ of the substrate is set to be within a range of from 1/12 to 1/5 of a vacuum wavelength $\lambda_{max}$ of a measurement upper limit frequency, namely $\lambda_{max}/12 \leqq \sqrt{\epsilon_r} \leqq \mu_{max}/5$.

* * * * *